(12) United States Patent
Liu et al.

(10) Patent No.: US 9,041,481 B2
(45) Date of Patent: May 26, 2015

(54) ARTIFICIAL MICROSTRUCTURE AND ARTIFICIAL ELECTROMAGNETIC MATERIAL USING THE SAME

(75) Inventors: Ruopeng Liu, Shenzhen (CN); Jinjin Wang, Shenzhen (CN); Zhiya Zhao, Shenzhen (CN); Lin Luan, Shenzhen (CN); Chaofeng Kou, Shenzhen (CN); Xin Xie, Shenzhen (CN); Guo Zhong, Shenzhen (CN); Jincai Ye, Shenzhen (CN)

(73) Assignees: KUANG-CHI INNOVATIVE TECHNOLOGY LTD., Shenzhen (CN); KUANG-CHI INSTITUTE OF ADVANCED TECHNOLOGY, Shenzhen (CN)

( * ) Notice: Subject to any disclaimer, the term of this patent is extended or adjusted under 35 U.S.C. 154(b) by 291 days.

(21) Appl. No.: 13/583,908

(22) PCT Filed: Oct. 27, 2011

(86) PCT No.: PCT/CN2011/081374
§ 371 (c)(1),
(2), (4) Date: Sep. 10, 2012

(87) PCT Pub. No.: WO2012/122804
PCT Pub. Date: Sep. 20, 2012

(65) Prior Publication Data
US 2013/0108856 A1 May 2, 2013

(30) Foreign Application Priority Data

Mar. 15, 2011 (CN) .......................... 2011 1 0061804
Apr. 28, 2011 (CN) .......................... 2011 1 0108562
Apr. 28, 2011 (CN) .......................... 2011 1 0108661
Apr. 30, 2011 (CN) .......................... 2011 1 0111984
Jun. 1, 2011 (CN) .......................... 2011 1 0145729
Jun. 1, 2011 (CN) .......................... 2011 1 0145751

(51) Int. Cl.
*H04B 3/40* (2006.01)
*B81B 7/00* (2006.01)
*H01Q 15/00* (2006.01)

(52) U.S. Cl.
CPC .............. *B81B 7/00* (2013.01); *H01Q 15/0086* (2013.01)

(58) Field of Classification Search
CPC .... H01Q 15/0086; G02B 1/002; G02B 1/007; B81B 7/00
USPC ..................... 333/219, 219.1, 219.2, 239, 23; 343/909, 700 MS
See application file for complete search history.

(56) References Cited

U.S. PATENT DOCUMENTS

| 7,071,889 | B2 * | 7/2006 | McKinzie et al. ............ 343/756 |
| 7,525,506 | B2 * | 4/2009 | Wu et al. ...................... 343/872 |
| 8,054,146 | B2 * | 11/2011 | Soukoulis et al. ............ 333/219 |
| 8,130,031 | B2 * | 3/2012 | Nguyen et al. ................ 327/565 |

(Continued)

FOREIGN PATENT DOCUMENTS

| CN | 1866612 A | 11/2006 |
| CN | 2870195 Y | 2/2007 |

(Continued)

OTHER PUBLICATIONS

The Design Synthesis of Multiband Artificial Magnetic Conductors Using High Impedance Frequency Selective Surface, pp. 1-3, by Douglas J. Kern, <<IEEE Transactions on Antennas and Propagation>>, published on Jan. 2005.

(Continued)

*Primary Examiner* — Dean Takaoka
*Assistant Examiner* — Alan Wong
(74) *Attorney, Agent, or Firm* — Leason Ellis LLP

(57) ABSTRACT

The present invention provides an artificial microstructure employed in an artificial electromagnetic material. The artificial microstructure includes a first segment, a second segment, and a third segment. The first segment is parallel to the second segment, and the third segment is connected between the first segment and the second segment. The artificial electromagnetic material has a special electromagnetic effect. The artificial electromagnetic material can be applied to various electromagnetic application systems instead of the typical electromagnetic material.

11 Claims, 55 Drawing Sheets

(56) References Cited

U.S. PATENT DOCUMENTS

| | | | |
|---|---|---|---|
| 8,198,953 B2 * | 6/2012 | Sanada | 333/23 |
| 8,421,550 B2 * | 4/2013 | Liu et al. | 333/32 |
| 2007/0215843 A1 * | 9/2007 | Soukoulis et al. | 252/570 |
| 2007/0236406 A1 | 10/2007 | Wen et al. | |
| 2010/0264524 A1 | 10/2010 | Song et al. | |
| 2011/0181490 A1 * | 7/2011 | Jung et al. | 343/909 |

FOREIGN PATENT DOCUMENTS

| | | |
|---|---|---|
| CN | 101335379 A | 12/2008 |
| CN | 101587990 A | 11/2009 |
| CN | 101919109 A | 12/2010 |
| EP | 2677348 A | 12/2013 |
| KR | 101008974 B | 1/2011 |

OTHER PUBLICATIONS

Left-handed Material Micro-structure Configuration Design Optimization, by Weikai Xu, pp. 6-9 and Figs 1.7, <<Chinese Doctoral Dissertations Full-text Database Engineering Science and Technology I>>, published on Sep. 30, 2010.

High Impedance Surface EBG Structure Antenna Application Research, by Yingying Gu, pp. 27-31 and Fig. 3.12, <<China Master's Theses Full-test Database Information Technology>>, published on Apr. 30, 2007.

Transmission and Reflection Properties of Terahertz Fractal Metamaterials, by Radu Malureanu, Andrei Lavrinenko, David G. Cooke, and Peter Uhd Jepsen, <<Lasers and Electro-Optics and Quantum Electronics and Laser Science Conference>>, published on May 21, 2010.

Zhou Lei et al: "Reflectivity of planar metallic fractal patterns", Applied Physics Letters, American Institute of Physics, US, vol. 82, No. 7, Feb. 17, 2003, pp. 1012-1014, XP012034782, ISSN: 0003-6951, DOI: 10.1063/1.1553993.

* cited by examiner

ARTIFICIAL MICROSTRUCTURE AND ARTIFICIAL ELECTROMAGNETIC MATERIAL USING THE SAME

CROSS-REFERENCE TO RELATED PATENT APPLICATIONS

This is a U.S. National Phase Application under 35 U.S.C. §371 of International Patent Application No. PCT/CN2011/081374, filed Oct. 27, 2011, and claims the priority of Chinese Patent Application Nos. CN201110145729.4 and CN201110145751.9 both filed Jun. 1, 2011; CN201110111984.7 filed Apr. 30, 2011; CN201110108562.4 and CN201110108661.2 both filed Apr. 28, 2011; and CN201110061804.9 filed Mar. 15, 2011, all of which are incorporated by reference herein.

FIELD OF THE INVENTION

The present invention relates to electromagnetic field, and particularly, to an artificial microstructure and an artificial electromagnetic material using the same.

BACKGROUND OF THE INVENTION

Metamaterial, also referred to artificial electromagnetic material, usually appears in various science literatures recently, as a new academic term for the physics field in 21st century. Three important characteristics of the metamaterial include:
1) The metamaterial is usually a compositive material having a novelty artificial structure;
2) The metamaterial has supernormal physical character (the character is not often included in the natural material);
3) The character of the metamaterial is not often decided by the nature character of the component material, but mainly decided by the artificial structure thereof.

That is to say, the metamaterial is a material that has artificial structures as the basic unit and spatially arranged in a specific way. And the metamaterial is a new type of material having a special electromagnetic effect which is characterized by the character of the artificial structures thereof. By sequentially designing the structure of the critical physical scale of the material, the limitations in some apparent laws of the nature can be broken through, to achieve an extraordinary material function which is beyond the inherent ordinary character in the nature.

The metamaterial includes the artificial structure. Wherein, the electromagnetic response of the artificial structure mainly depends on the topological feature and size of the structure unit of the artificial structure.

The metamaterial also includes the host material where the artificial structure attaches to. The host materials plays a supporting role for the artificial structure, therefore it can be any material which is different from the artificial structure.

The stacking of the artificial structure and the host material can produce an equivalent dielectric constant $\xi$ and a magnetic conductivity $\mu$. The two physics parameters respectively correspond to the electric field response and magnetic field response. Therefore, the designation for the artificial structure of the metamaterial is the most critical step in the field of metamaterials. How to implement an artificial electromagnetic material and further improve the electromagnetic character of the conventional electromagnetic material has been a big difficult problem to the improvement of the modern technology.

DISCLOSURE OF THE INVENTION

The present invention provides an artificial microstructure employed in an artificial electromagnetic material, comprising a first segment, a second segment, and a third segment, wherein the first segment is parallel to the second segment, and the third segment is connected between the first segment and the second segment.

Wherein, two ends of the third segment is perpendicularly connected to the midpoint of the first segment and the midpoint of the second segment, respectively.

The first segment, the second segment and the third segment form a 工-shaped structure.

The artificial microstructure comprises a terminal segment group, the terminal segment group comprises a plurality of fourth segments, two ends of the first segment and two ends of the second segment are respectively and perpendicularly connected to one of the fourth segments.

The artificial microstructure comprises N terminal segment groups, each segment of the N-th terminal segment group is connected to a distal of one segment of the N-1-th terminal segment group, and is perpendicular to the connected segment of the N-1-th segment group, wherein N is an integer number greater than 1.

The artificial microstructure comprises six 工 shaped structures, the third segments of two of the 工 shaped structures are perpendicularly connected, and the connection point is located in the center of the two third segments, the remaining four 工-shaped structures are 90-degree rotationally symmetrical to the connection point.

The artificial structure is a fence structure, the fence structure comprises a first segment, a second segment, and a third segment, and further comprises an intermediate segment group, the intermediate segment group comprises at least two fifth segments, the at least two fifth segments are connected to the third segment and equally divided by the third segment, the at least two fifth segments are parallel to the first segment and the second segment.

The length of the first segment, the second segment, and the fifth segments, along the third segment, gradually increases from the midpoint of the third segment to two sides of the midpoint, or gradually decreases from the midpoint of the third segment to two sides of the midpoint, or the first segment, the second segment, and the fifth segment have the same length.

The artificial structure comprises two said fence structures, the third segments of the two fence structures are perpendicularly connected to each other, and the connection point is in the middle of the two third segments.

The artificial structure comprises two said fence structures, the third segments of the two fence structures are perpendicularly connected to each other, and the connection point is in the middle of the two third segments.

A bent portion is comprised between two ends of the third segment.

The bent portion comprises at least one roundabout part comprising at least two reversed U-shaped structures connected end to end, each U-shaped structure comprises a first lateral line, a second lateral line, and a connecting line, the first lateral line is parallel to the second lateral line, two ends of the connecting line are respectively connected to one end of the first lateral line and one end of the second lateral line.

Both of the first lateral line and the second lateral line are perpendicular or parallel to the first segment and the second segment.

The bent portion comprises two segments of spiral wires which are parallelly convoluted in a same direction, from two ends of the third segment.

The two segments of spiral wire are inwardly winded from the outer circle to the inner circle, in a counterclockwise way, or outwardly winded from the inner circle to the outer circle, in a clockwise way.

The quantity of the circle of the two segments of spiral wire is greater than 2.

The two segments of spiral wire are selected from one of the circular spiral wires, square spiral wires, and triangle spiral wires.

The portions located in the center of the spiral of the two segments of the spiral wire are disconnected from each other.

The size of the artificial microstructure is equal to or smaller than one fifth of the wavelength of the electromagnetic wave responded thereto.

The artificial microstructure is made of metal material.

Accordingly, the present invention further provides an artificial electromagnetic material comprising a substrate and the artificial microstructure mentioned above, the substrate comprises a plurality of substrate units, the artificial microstructure is employed in each of the substrate units.

The metamaterial used in the above embodiments is a new material with special electromagnetic effects. The artificial electromagnetic material can replace the conventional magnetic material, and be applied to various applications using electromagnetic waves. For example, it can be applied to electromagnetic wave propagation modulation materials and devices, such as antenna, smart antennas, angle zooming and so on, or applied to the field of electromagnetic mode modulation of the waveguide system, functional polarization modulation devices, microwave circuits, THz (terahertz), or optical applications.

BRIEF DESCRIPTION OF THE DRAWINGS

Other aspects, features, and advantages of this invention will become apparent from the following detailed description when taken in conjunction with the accompanying drawings, which are a part of this disclosure and which illustrate, by way of example, principles of this invention.

DETAILED DESCRIPTION OF ILLUSTRATED EMBODIMENTS

To improve the electromagnetic characteristics of the typical electromagnetic material in the existing technology, the present disclosure provides a kind of artificial electromagnetic material, which is applied to various electromagnetic application systems instead of the typical electromagnetic material.

Figure 1:
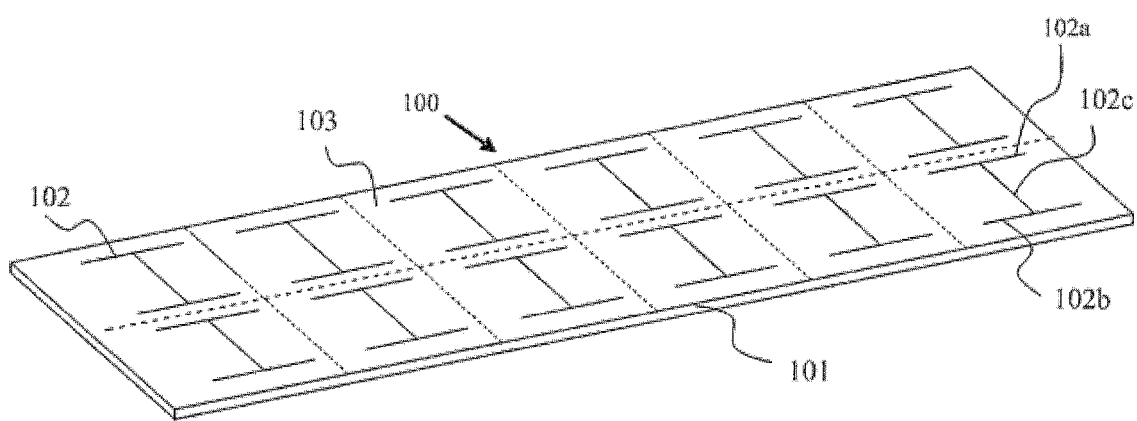
FIG. 1 is a schematic diagram of an artificial electromagnetic material, according to a first embodiment of the present disclosure.

Referring to FIG. 1, a schematic diagram of an artificial electromagnetic material 100, according to a first embodiment of the present disclosure, is shown. The artificial electromagnetic material 100 includes a substrate 101 virtually divided into a number of substrate units 103, such as the sections divided by the broken lines and the edge of the substrate 101 shown in the figure. The artificial electromagnetic material 100 according to the present disclosure further includes a number of artificial microstructures 102, which are respectively formed in the substrate units 103. In the present embodiment, the substrate 101 is made of Polytetrafluoroethene (PTFE). In other embodiments, the substrate 101 may be made of dielectric material, such as ceramics, etc. The size of the substrate unit 103 and that of the artificial microstructure 102 can be adjusted according to various requirements. For example, when the artificial electromagnetic material 100 is required to response to the electromagnetic wave with wavelength $\lambda$, the size of the substrate unit 103 and that of the artificial microstructure 102 are set to be smaller than one fifth of the wavelength $\lambda$. For simplifying the manufacturing process, the size of the substrate unit 103 and that of the artificial microstructure 102 are advantageously chosen to be one tenth of the wavelength $\lambda$. For example, in the present embodiment, it is needed to response to the electromagnetic wave with wavelength at 3 cm, thus the size of the substrate unit 103 and that of the artificial microstructure 102 are set to be in 1.5 mm-3 mm, preferably at 1.5 mm.

Since the electromagnetic characteristics of the artificial electromagnetic material are mainly determined by the microstructure 102, the topology pattern of a metal wire of the microstructure 102 is specially designed in the present invention. The present microstructure 102 is required to response to an electric field, thus, the pattern of the microstructure 102 has to be polarized along a direction of the electric field. Here, "the pattern of the microstructure 102 polarized" means that the pattern must have a projection along the direction of the electric field. For example, when the direction of the electric field is vertical and the microstructure 102 is a straight metal wire along the horizontal direction, the microstructure 102 will not have projection along the vertical direction, therefore the pattern of the microstructure 102 does not have polarity and cannot response to the electric field, and further cannot complete a function of magnifying the dielectric constant, as mentioned in the present invention. The microstructure 102 shown in FIGS. 1-4 can complement the purpose of the present invention.

Figure 3:
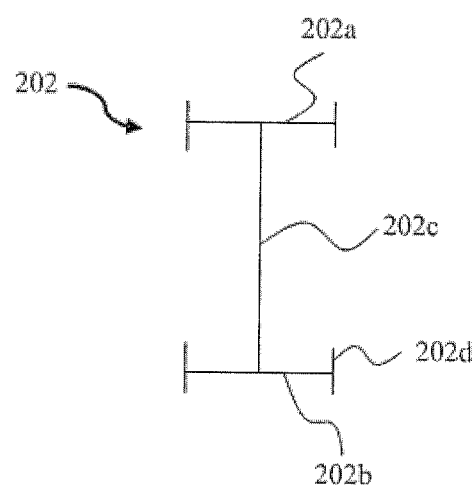
FIG. 3 is a schematic diagram of an artificial microstructure, according to a second embodiment of the present disclosure.
Figure 4:
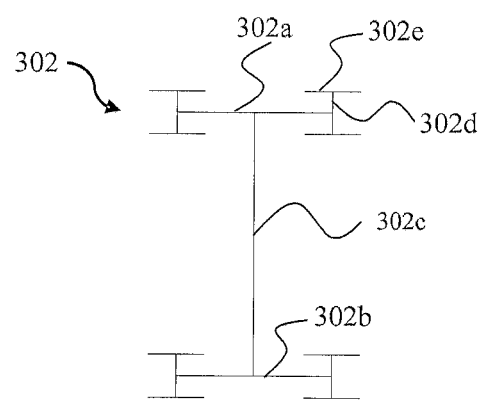
FIG. 4 is a schematic diagram of an artificial microstructure, according to a third embodiment of the present disclosure.

FIGS. 1, 3, and 4 show the microstructures 102 mainly used to response to a one-dimension electric field.

Figure 2:
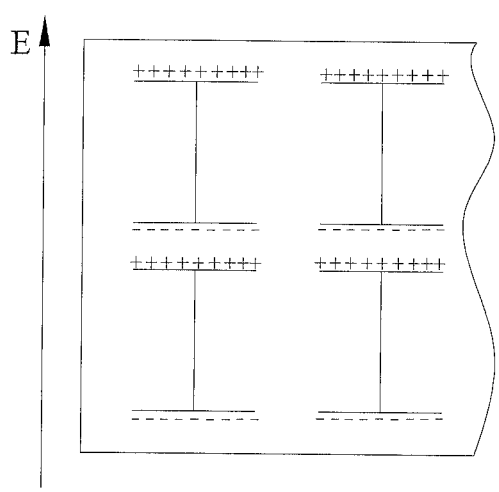
FIG. 2 is an equivalent schematic diagram of the artificial electromagnetic material of FIG. 1, during the artificial electromagnetic material passing through a one-dimension electric field.

Please refer to FIG. 1 and FIG. 2 in combination, the microstructure 102 is shaped as a Chinese character "工". The microstructure 102, provided in the first embodiment of the present invention, includes a first segment 102a, a second segment 102b and a third segment 102c. The first segment 102a is parallel to the second segment 102b. The third segment 102c is interconnected between the first segment 102a and the second segment 102b, and two ends of the third segment 102c are respectively perpendicularly connected to a midpoint of the second segment 102b and a midpoint of the third segment 102c. The microstructure 102 is generally a planar or a solid structure having a specific geometric shape, constituted with metal wire, such as copper wire or silver wire. Herein, the metal wire can be copper wire or silver wire with a columned section plane or a platy section plane. It is understood that the sectional plane of the metal wire can be in other shapes. The microstructure 102 can attach to the substrate unit 103 by etching, plating, drilling, photoetching, electronic engraving, ion etching or in other way.

When the electric field is parallel to the third segment 102c or has a projection along the direction of the third segment 102c, the first segment 102a and the second segment 102b on the two ends of the microstructure 102 with the 工 shape collect equal positive and negative charges, respectively, under the action of the electric field, such as FIG. 2, so that to form an equivalent capacitor. Since the microstructure 102 is attached to the substrate 101 which has higher dielectric constant, and the capacitance of the equivalent capacity is proportional to the dielectric constant of the substrate 101, the capacitance of the equivalent capacity is increased, and the equivalent dielectric constant of the artificial electromagnetic material constituted with the microstructure 102 and the dielectric will be in multiples of the dielectric constant of the dielectric itself.

FIGS. 3 and 4 are the structures of the microstructure 102 derived from the 工 shape shown in FIG. 1.

Please refer to FIG. 3, which is a schematic diagram of an artificial microstructure 202 provided by a second embodiment of the present disclosure. The artificial microstructure 202 is substantially similar to the artificial microstructure 102, and the difference is that, except including the first segment 202a, the second segment 202b, and the third segment 202c the artificial microstructure 202, further includes a terminal segment group. The terminal segment group includes a number of fourth segments 202d. Two ends of the first segment 202a and two ends of the second segment 202b are respectively and perpendicularly connected to one of the fourth segments 202d. Preferably, the first segment 202a and second segment 202b are the respective perpendicular bisector of each fourth segment 202d.

Please refer to FIG. 4, which is a schematic diagram of a artificial microstructure 302 provided by a third embodiment of the present disclosure. The artificial microstructure 302 is substantially similar to the artificial microstructure 202, and the difference is that the artificial microstructure 302 further includes a second segment group including a number of fifth segments 302e. Two ends of each fourth segment 302d are respectively connected to one of the fifth segments 302e. Each fifth segment 302e is perpendicular to the fourth segment 302d. Inferring from this, the artificial microstructure 302 may include a third segment group (and fourth segment group etc.) consisting of segments each connected to two ends of the fifth segment 302e and perpendicular to the fifth segment 302e. When the artificial microstructure 302 includes N segment groups, each segment of the N-th group is connected to two ends of the segment of the N-1-th segment group, and is perpendicular to the connected segment of the N-1-th segment group. The N here is a natural number greater than or equal to 1. All of these structure derived from the 工 shape is belonged to the derived structure of the microstructure with the 工 shape in the present invention.

In employing the artificial microstructure as shown in FIGS. 1, 3 and 4, it is mainly considered to response to the electric field component in a direction parallel to the third segment 202c, and form an equivalent capacitor. When there is a small electric field component perpendicular to the direction of the third segment 202c in the space, the other metal wire perpendicular to the third segment 202c can also be a response.

Figure 5:
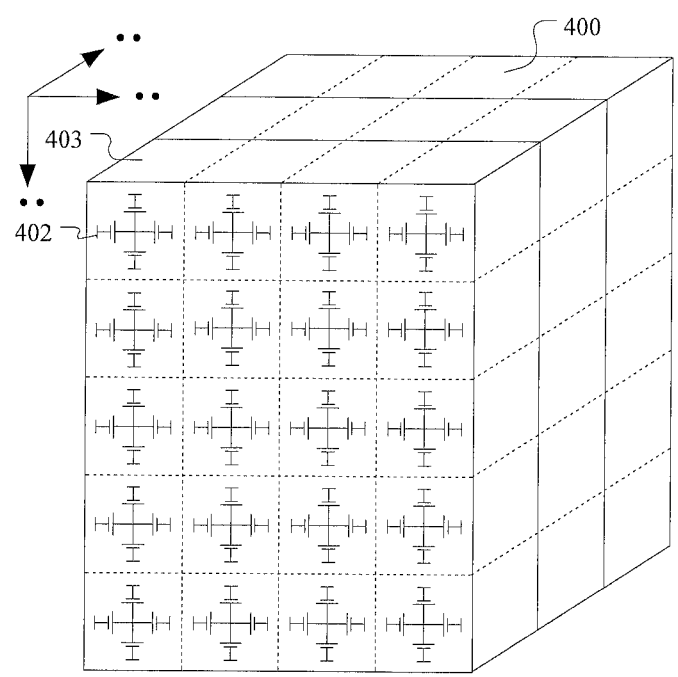
FIG. 5 is a schematic diagram of an artificial electromagnetic material, according to a fourth embodiment of the present disclosure.
Figure 6:
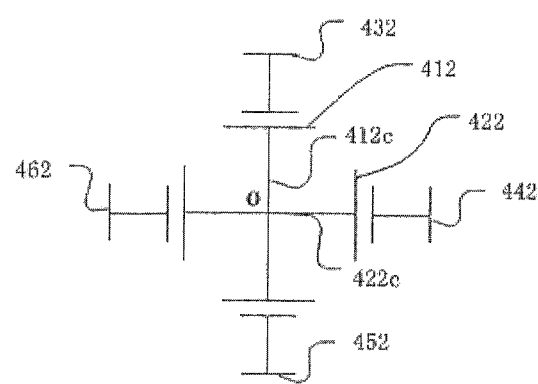
FIG. 6 is a schematic diagram of an artificial electromagnetic material, according to a fourth embodiment of the present disclosure.

Please also refer to FIG. 5 and FIG. 6, a fourth embodiment of the present invention provides an artificial electromagnetic material 400. In the present embodiment, a number of artificial electromagnetic material 400 blocks are stacked in sequence along the direction perpendicular to the artificial electromagnetic material 400 plane (z axis), to make the number of artificial electromagnetic material 400 blocks be a unity through assembly or filling in between each two artificial electromagnetic material 400 blocks with substance, such as liquid host material, which is capable of connecting the two blocks and can adhere the two artificial electromagnetic material 400 blocks together after the substance is cured. The artificial electromagnetic material 400 can be made of, but are not limited to, ceramic material with high dielectric constant, such as FR-4, F4b, CEM1, CEM3 or the TP-1 and so on.

The substrate units 103 of the artificial electromagnetic material 400 are arranged as an array, with X-direction defined as the row, and Y-direction, which is perpendicular to the X-direction, defined as the column. Each unit 403 includes an artificial microstructure 402.

The difference between the artificial microstructure 402 and the artificial microstructure 102 of the first embodiment is that the artificial microstructure 402 includes six 工-shaped structures 412, 422, 432, 442, 452, and 462 consist of the first segment 402a, the second segment 402b and the third segment 402c. The third segments of two 工-shaped structures 412 and 422 are perpendicular connected to each other, and the connection point O is located in the center of the two third segments 412c, 422c. The remaining four 工-shaped structures 432, 442, 452, 462 are symmetrical relative to the connection point O. Wherein, a line connecting the middle of the 工-shaped structures 432, 412 and 452 is a straight line. A line connecting the middle of the 工-shaped structures 462, 422 and 442 is also a straight line.

Figure 7:
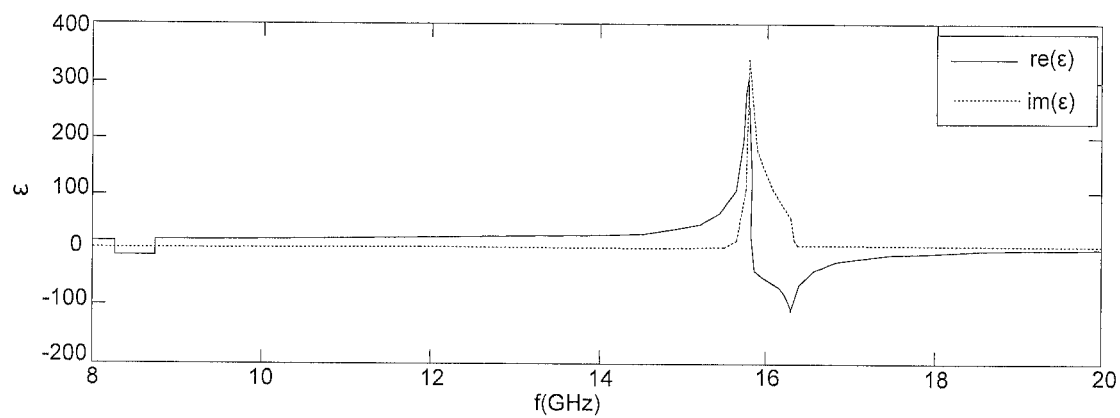
FIG. 7 is a schematic diagram showing the relation between dielectric constant and frequency, in accordance with the artificial electromagnetic material shown in FIG. 5.
Figure 8:
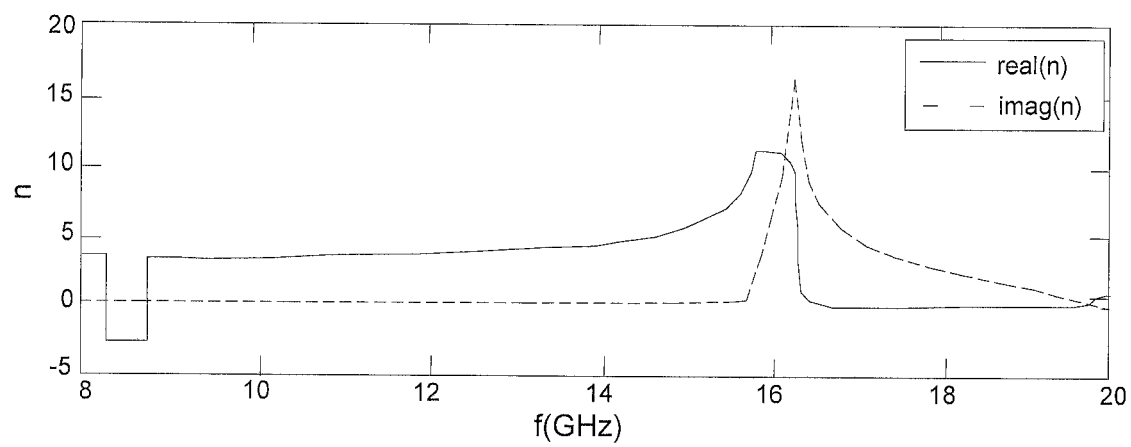
FIG. 8 is a schematic diagram showing the relation between refractive index and frequency, in accordance with the artificial electromagnetic material shown in FIG. 5.

By changing the shape of the artificial microstructure in the first embodiment, i.e. setting four rotationally symmetric 工 shapes around the mutually orthogonal 工 shapes, the present invention can increase the dielectric constant and the refractive index of the artificial electromagnetic material. Through simulation, the results show that, in a very wide band of frequency, the dielectric constant of the artificial electromagnetic material having this artificial microstructure is very stable. And comparing to the artificial electromagnetic material having 工-shaped artificial microstructure, the dielectric constant and the refractive index thereof are significantly increased. As shown in FIG. 7 and FIG. 8, the present invention has higher dielectric constant (e.g. more than 100) in the case of low loss, and has higher refractive index (e.g. reach up to 10.1) in a certain frequency range (8.5 GHz~15.8 GHz). Such artificial electromagnetic material with high dielectric constant can be applied in the field of antenna manufacturing and semiconductor manufacturing. And since breaking through the limitation of the dielectric constant in per volume unit, as the defects in the existing technology, this technical solution can play an invaluable role for the miniaturization of microwave devices as well.

Figure 9:
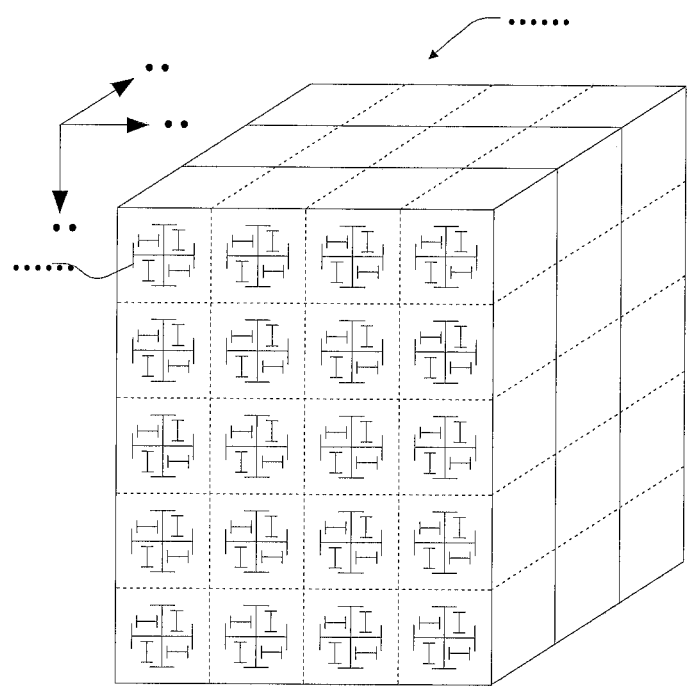
FIG. 9 is a schematic diagram of an artificial electromagnetic material, according to a fifth embodiment of the present disclosure.
Figure 10:
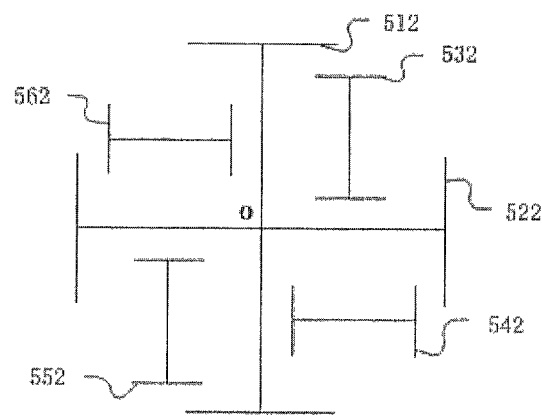
FIG. 10 is a schematic diagram of an artificial microstructure of the artificial electromagnetic material shown in FIG. 9.

Please also refer to FIG. 9 and FIG. 10, the difference between the artificial electromagnetic material 500 provided in a fifth embodiment of the present invention and the artificial electromagnetic material 400 shown in FIG. 5 is: four ⊥ shapes 532, 542, 552 and 562, which are rotationally symmetric to the intersection O, are respectively located in a space formed by the angle between two mutually orthogonal ⊥ shapes 512 and 522.

Figure 11:
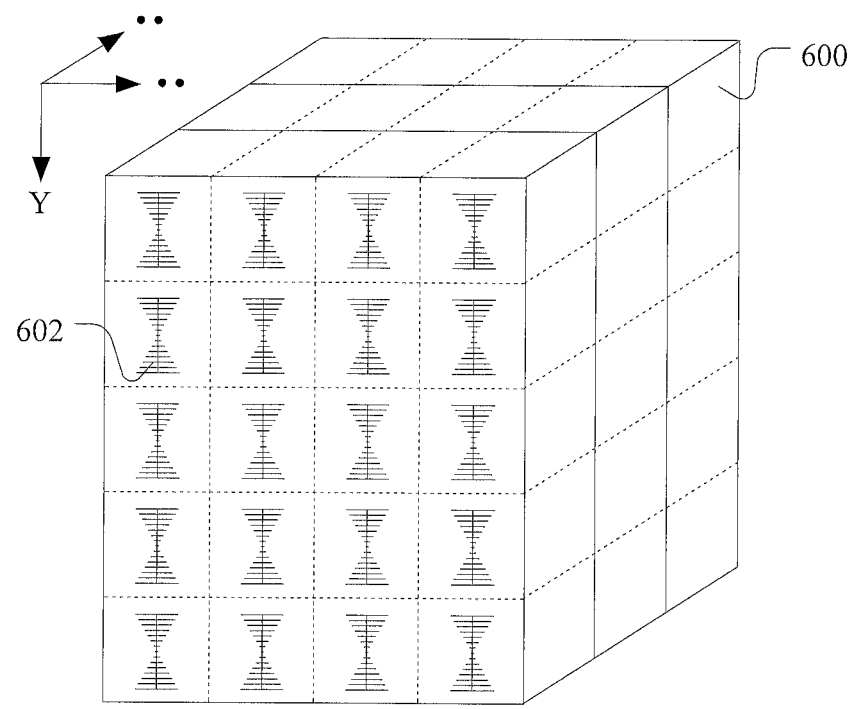
FIG. 11 is a schematic diagram of an artificial electromagnetic material, according to a sixth embodiment of the present disclosure.
Figure 12:
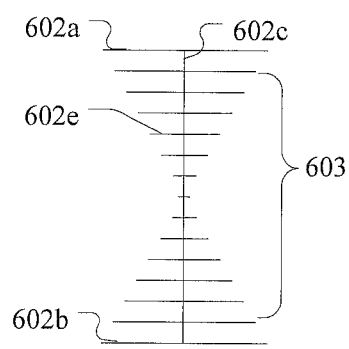
FIG. 12 is a schematic diagram of an artificial microstructure of the artificial electromagnetic material shown in FIG. 11.

Please also refer to FIGS. 11 and 12, the difference between the artificial electromagnetic material 600 provided in a sixth embodiment of the present invention and the artificial electromagnetic material 100 shown in FIG. 1 is that the artificial electromagnetic material 600 is a fence structure. The fence structure includes a first segment 602a, a second segment 602b, and a third segment 602c to constitute a ⊥ -shaped structure, and further includes an intermediate segment group 603. The intermediate segment group 603 includes at least two fifth segments 602e connected to the third segment 602c and bisected by the third segment 602c. The at least two fifth segments 602e are parallel to the first segment 602a and the second segment 602b. Wherein, the length of the first segment 602a, the second segment 602b, and the fifth segment 602e gradually increases along a direction from the midpoint of the third segment 602c to both sides of midpoint.

Figure 13:
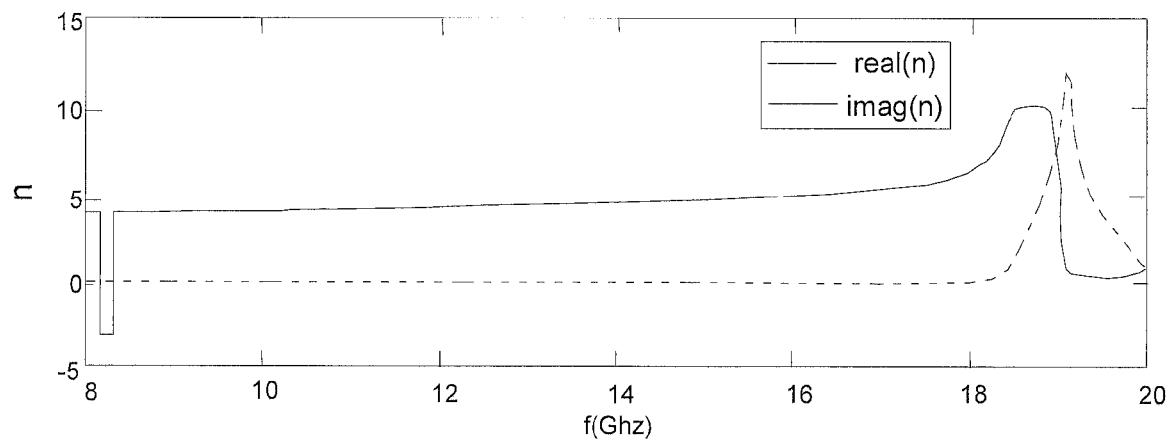
FIG. 13 is a schematic diagram showing the relation between dielectric constant and frequency, in accordance with the artificial electromagnetic material shown in FIG. 11.
Figure 14:
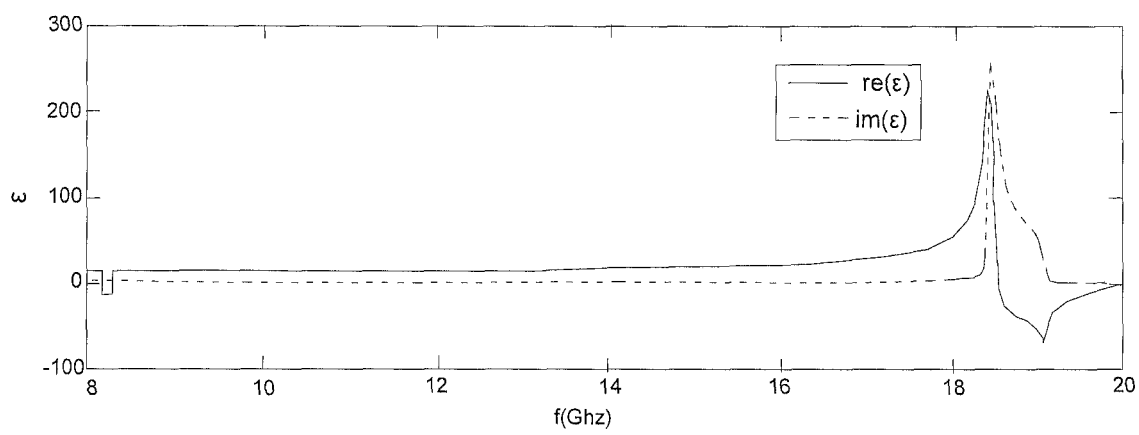
FIG. 14 is a schematic diagram showing the relation between refractive index and frequency, in accordance with the artificial electromagnetic material shown in FIG. 11.

By changing the shape of the artificial microstructure in the first embodiment, i.e. adding the intermediate segment group 603, the dielectric constant and the refractive index of the artificial electromagnetic material are increased. The simulation is shown in FIGS. 13 and 14. Seen from FIG. 13, when the frequency is between 8.3 GHz-18.5 GHz, all of the refractive index is above 4.2. Seen from FIG. 14, the dielectric constant can reach to 150 or above, in a certain frequency range, and the loss is relatively low, the bandwidth can reach to 10 GHz. Therefore, after the simulation, the results are shown in a very wide band of frequency. Compared the artificial electromagnetic material having such artificial microstructure to the artificial electromagnetic material having ⊥ -shaped artificial microstructure, the dielectric constant and the refractive index are significantly improved. Such artificial electromagnetic material with high dielectric constant can be applied in the field of antenna manufacturing and semiconductor manufacturing. And since breaking through the limitation of the dielectric constant in per volume unit, as the defects in the existing technology, this technical solution can play an invaluable role for the miniaturization of microwave devices as well.

Figure 15:
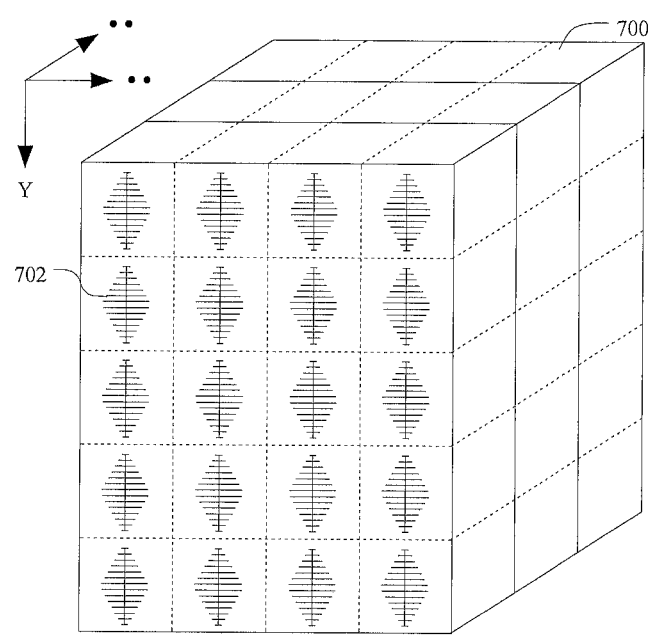
FIG. 15 is a schematic diagram of an artificial electromagnetic material, according to a seventh embodiment of the present disclosure.
Figure 16:
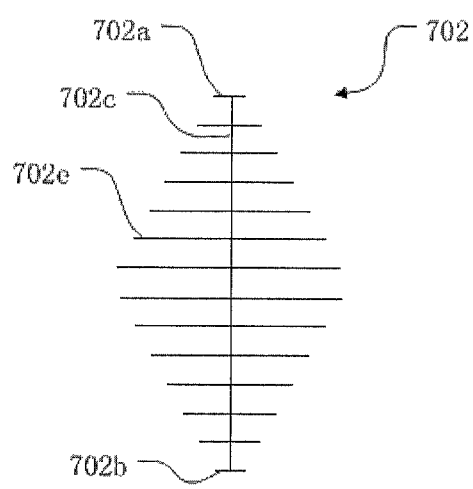
FIG. 16 is a schematic diagram of an artificial microstructure of the artificial electromagnetic material shown in FIG. 15.

Please also refer to FIG. 15-16, the difference between the artificial electromagnetic material 700 provided in a seventh embodiment of the present invention and the artificial electromagnetic material 600 shown in FIGS. 11 and 12 is that the length of the first segments 702a, the second segments 702b, and the fifth segments 702e of the artificial microstructure 702 decreases from the midpoint of the third segment 702c to both sides of the midpoint.

Figure 17:
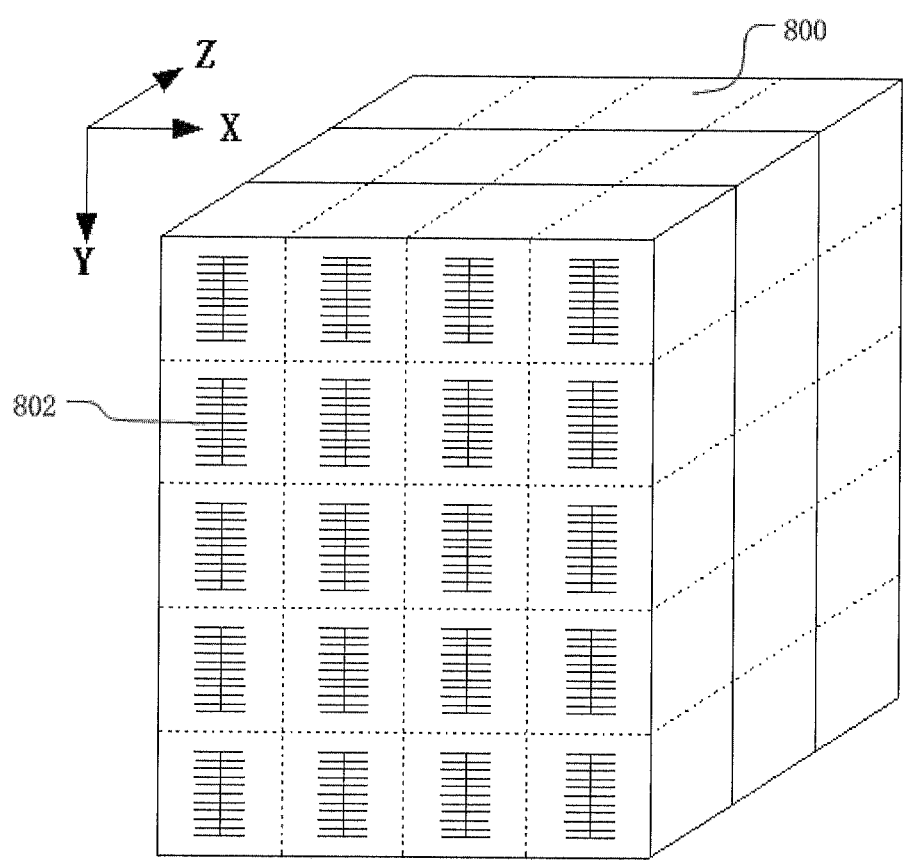
FIG. 17 is a schematic diagram of an artificial electromagnetic material, according to an eighth embodiment of the present disclosure.
Figure 18:
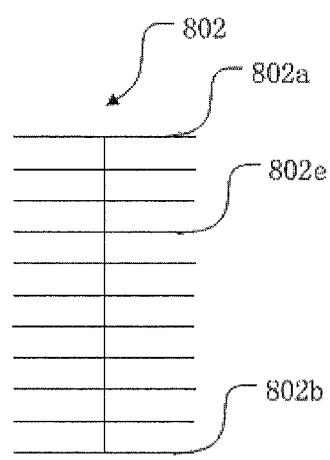
FIG. 18 is a schematic diagram of an artificial microstructure of the artificial electromagnetic material shown in FIG. 17.

Please also refer to FIG. 17-18, the difference between the artificial electromagnetic material 800 provided in an eighth embodiment of the present invention and the artificial electromagnetic material 600 shown in FIGS. 11 and 12 is that all of the length of the first segments 802a, the second segments 802b and the fifth segments 802e of the artificial microstructure 802 is the same.

Figure 19:
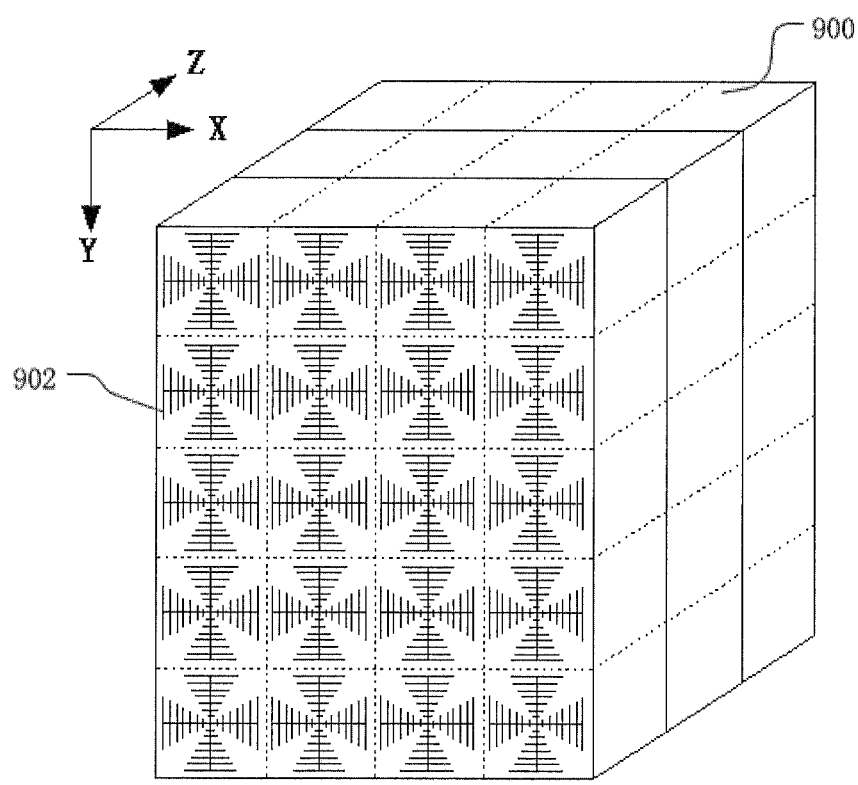
FIG. 19 is a schematic diagram of an artificial electromagnetic material, according to a ninth embodiment of the present disclosure.
Figure 20:
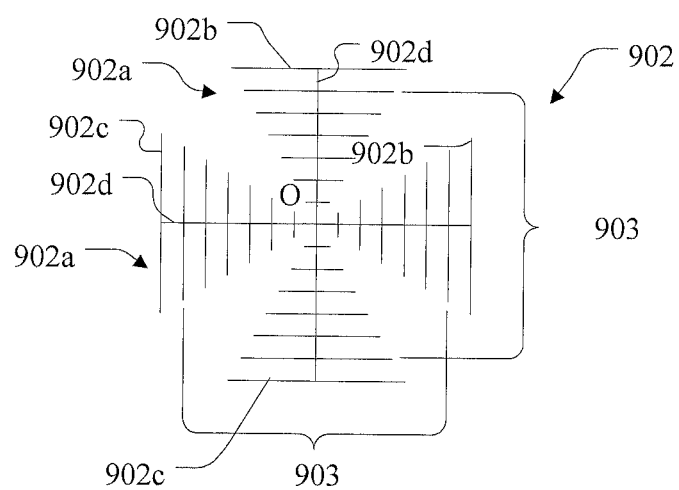
FIG. 20 is a schematic diagram of an artificial microstructure of the artificial electromagnetic material shown in FIG. 19.

Please also refer to FIG. 19-20, the difference between the artificial electromagnetic material 900 provided in a ninth embodiment of the present invention and the artificial electromagnetic material 600 shown in FIGS. 11 and 12 is that the artificial microstructure 902 includes two fence structures 902a each including the first segment 902b, the second segment 902c, the third segment 902d, and the intermediate segment group 903. The intermediate segment group 903 is located on the third segment 902d and perpendicular to the third segment 902d. The third segments 902d of the two fence structures 902a are perpendicular to each other and equally divided.

Figure 21:
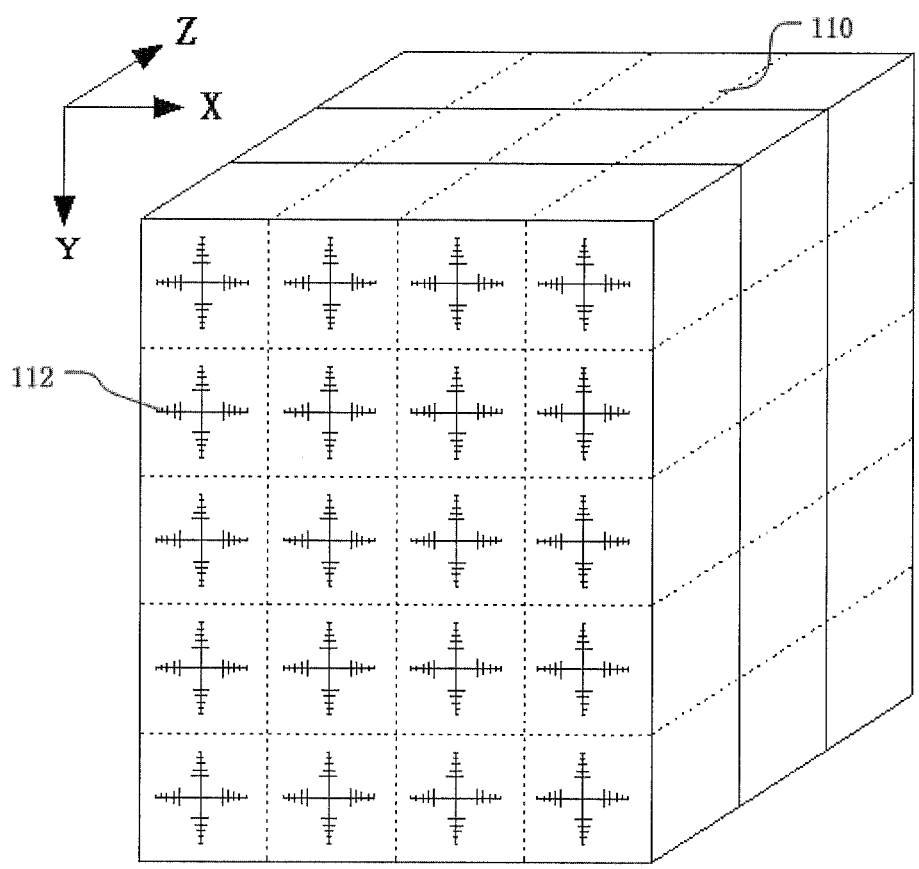
FIG. 21 is a schematic diagram of an artificial electromagnetic material, according to a tenth embodiment of the present disclosure.
Figure 22:
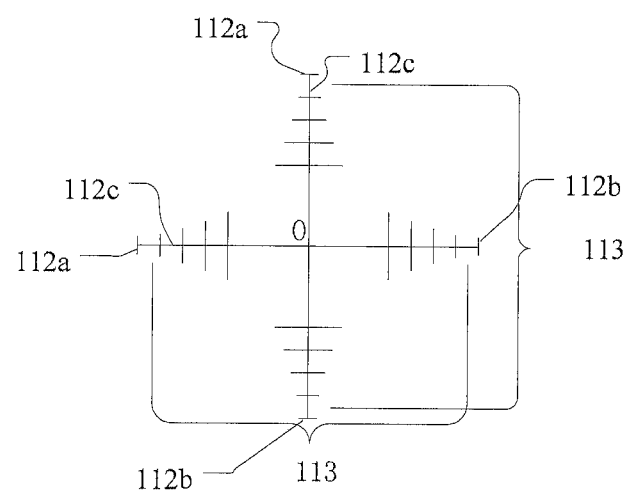
FIG. 22 is a schematic diagram of an artificial microstructure of the artificial electromagnetic material shown in FIG. 21.

Please also refer to FIG. 21-22, the difference between the artificial electromagnetic material 110 provided in a tenth embodiment of the present invention and the artificial electromagnetic material 700 shown in FIGS. 15 and 16 is that the artificial microstructure 112 thereof includes two perpendicular quadrature fence structures as shown in FIG. 16. Each fence structure includes first segment 112a, second segment 112b, third segment 112c, and intermediate segment group 113 which is located on the third segment 112c. The two third segments 112c of the fence structures 113 are perpendicular to each other and equally divided.

Figure 23:
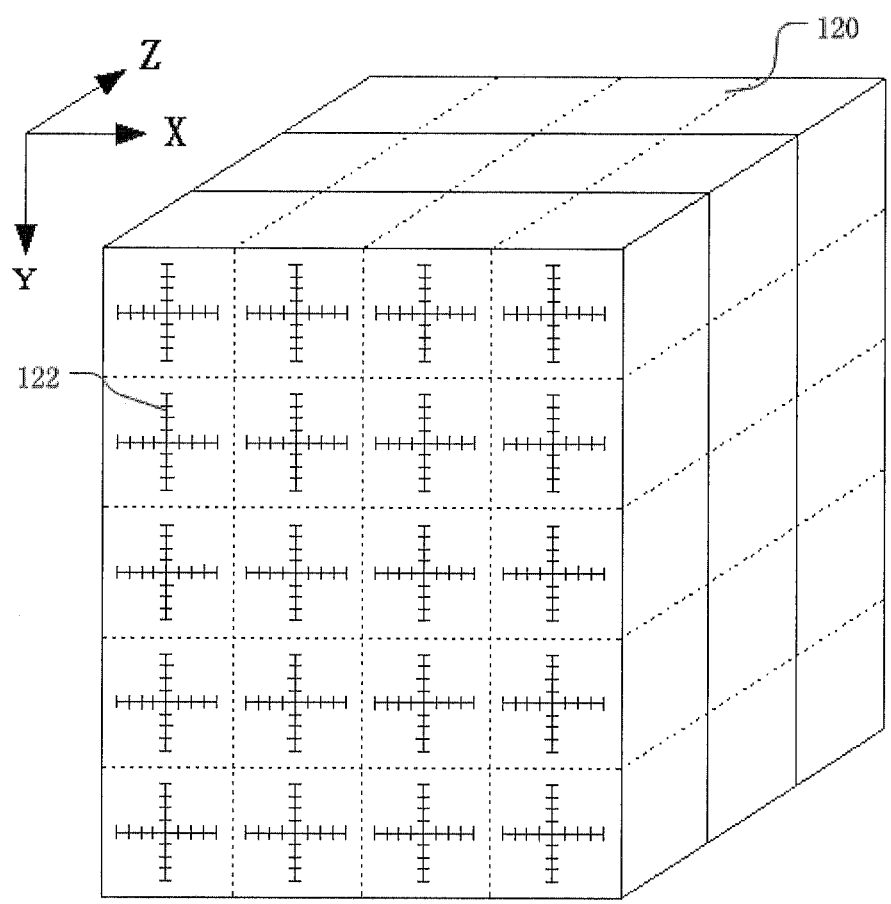
FIG. 23 is a schematic diagram of an artificial electromagnetic material, according to an eleventh embodiment of the present disclosure.
Figure 24:
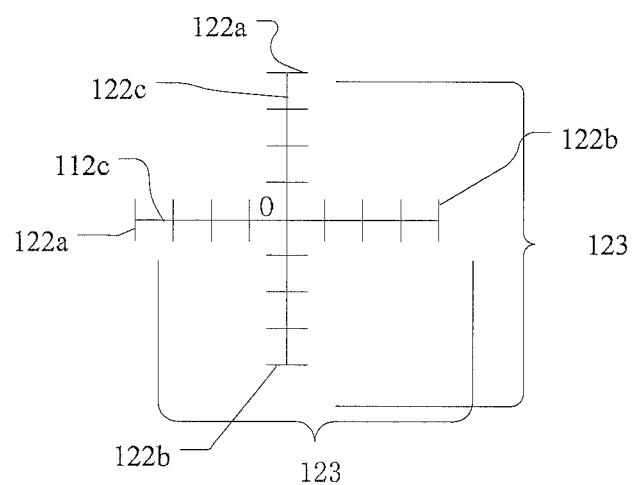
FIG. 24 is a schematic diagram of an artificial microstructure of the artificial electromagnetic material shown in FIG. 23.

Please also refer to FIG. 23-24, the difference between the artificial electromagnetic material 120 provided in an eleventh embodiment of the present invention and the artificial electromagnetic material 800 shown in FIGS. 17 and 18 is that the artificial microstructure 122 includes two perpendicular quadrature fence structures as shown in FIG. 18. Each fence structure includes a number of first segments 122a, a number of second segments 122b, a number of third segments 122c, and an intermediate segment group 123 located on third segments 122c. The two third segments 122c with ⊥ -shaped structure are perpendicular to each other and equally divided.

Figure 25:
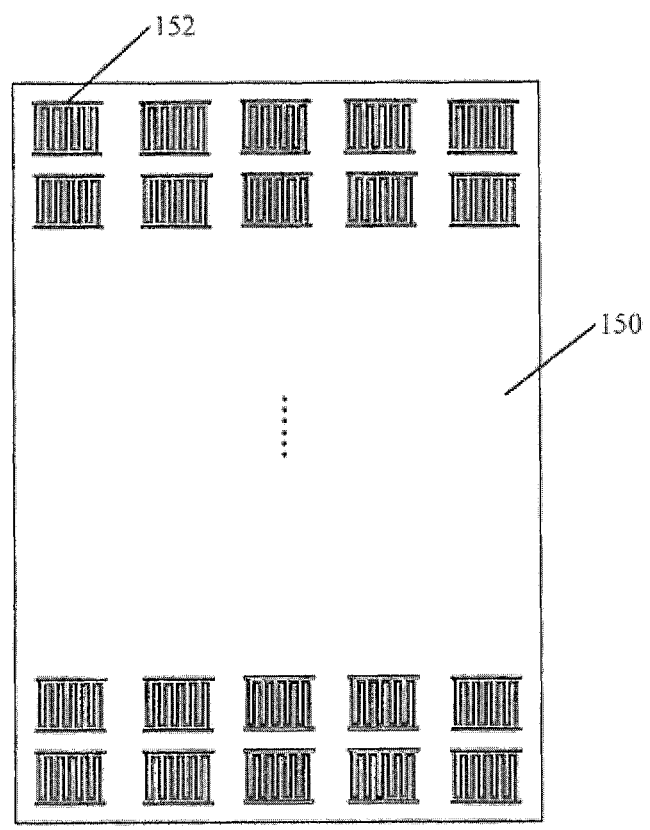
FIG. 25 is a schematic diagram of an artificial electromagnetic material, according to a twelfth embodiment of the present disclosure.
Figure 26:
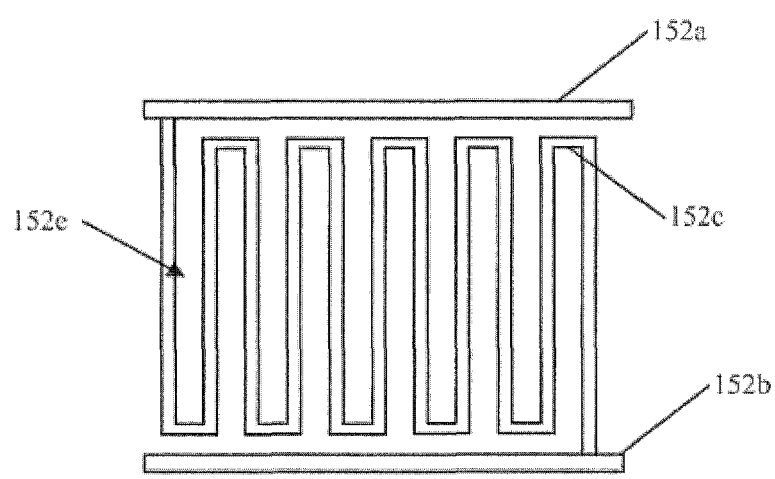
FIG. 26 is a schematic diagram of an artificial microstructure of the artificial electromagnetic material shown in FIG. 25.
Figure 27:
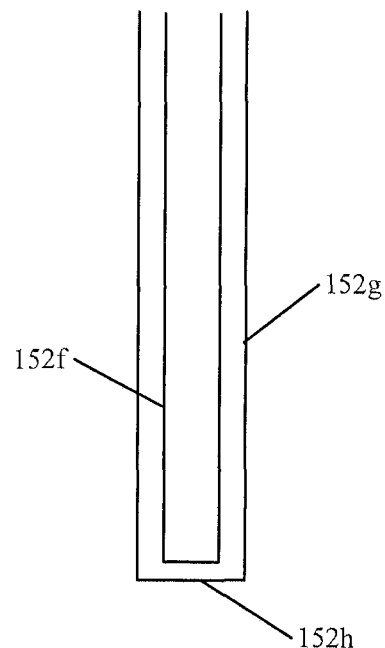
FIG. 27 is a schematic diagram of a U-shaped structure of the artificial microstructure shown in FIG. 26.

Please refer to FIGS. 25-27 in combination, the difference between the artificial microstructure 152 of an artificial electromagnetic material 150 provided in a twelfth embodiment of the present invention and the artificial microstructure shown in FIG. 1 is that a bent portion 152e is included between two ends of the third segment 152c of the artificial microstructure 152. The bend portion 152e includes at least one roundabout part including at least two reversed U-shaped structures connected end to end. Each U-shaped structure includes a first lateral line 152f, a second lateral line 152g, and a connecting, line 152h. The first lateral line 152f is parallel to the second lateral line 152g. Two ends of the connecting line 152h are respectively connected to one end of the first lateral line 152f and one end of the second lateral line 152g. In this embodiment, both of the first lateral line 152f and the second lateral line 152g are perpendicular to the first segment 152a and the second segment 152b.

In the present embodiment, by improving the designation of the ⊥ shape artificial microstructure, i.e. replacing the vertical lines of the third segment 152c with the roundabout part. This designation increases the length of the third segment 152c between the first segment 152a and the second segment 152b, thus increasing the dielectric constant of the artificial microstructure and improving the refractive index. By using the artificial electromagnetic material which is made of the present artificial microstructure, the bottleneck of the field of manufacturing, such as antenna manufacturing and semiconductor manufacturing, can be broken through, and the artificial electromagnetic material can plays an invaluable role for the miniaturization of microwave devices.

Figure 28:
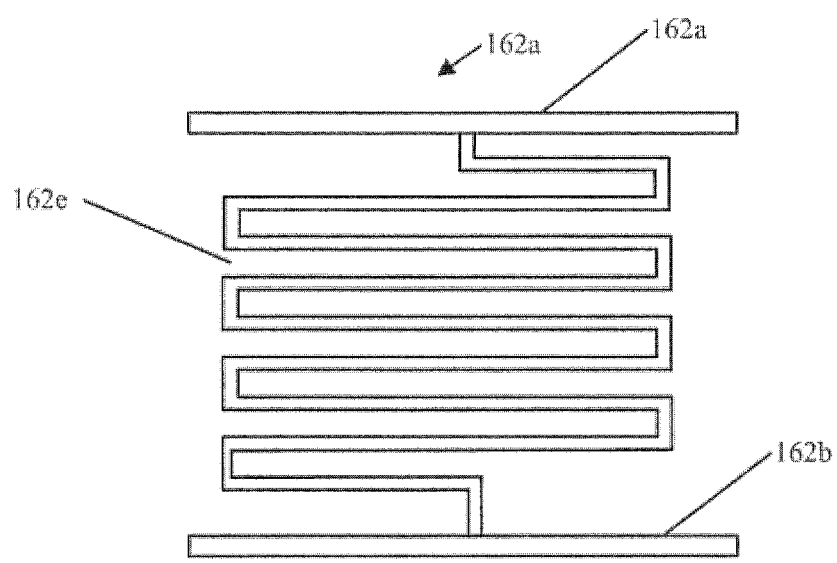
FIG. 28 is a schematic diagram of an artificial electromagnetic material, according to a thirteenth embodiment of the present disclosure.
Figure 29:
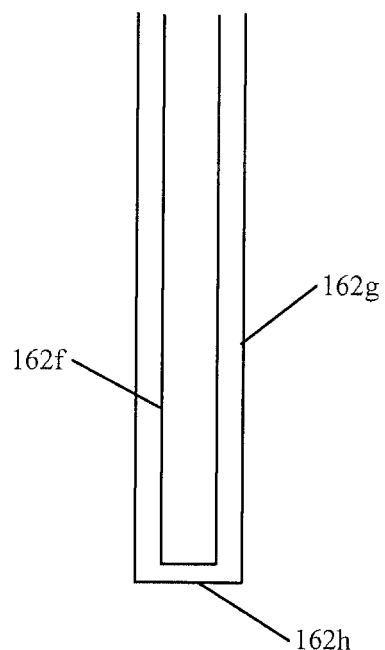
FIG. 29 is a schematic diagram of a U-shaped structure of the artificial microstructure shown in FIG. 28.

Please refer to FIGS. 28-29 in combination, the difference between the artificial microstructure 162 provided in a thirteenth embodiment of the present invention and the artificial microstructure shown in FIGS. 26-27 is that the first lateral line 162f and the second lateral line 162g of the artificial microstructure 162 are parallel to the first segment 162a and the second segment 162b. The length of the connecting line is shorter than that of the first lateral line 162f or the second lateral line 162g.

In addition to the first U-shaped structure and the last U-shaped structure, the length of the first lateral line 162f and that of the second lateral line 162g in each bent portion 162e are the same, and two adjacent lateral lines in two adjacent U-shaped structures are overlapping or share the same lateral line. For the first U-shaped structure and the last U-shaped structure of the bent portion 162e, the length of the first lateral line 162f is longer than that of the second lateral line 162g, so that the first lateral line 162f of the first U-shaped structure and the first lateral line 162f of the last U-shaped structure are respectively connected to the first segment 162a and the second segment 162b. The length of two lateral lines of the U-shaped structure can be designed to be, e.g. one longer than the other, according to actual requirements. The length of the bottom of the U-shaped structure is longer than that of the sides.

Figure 30:
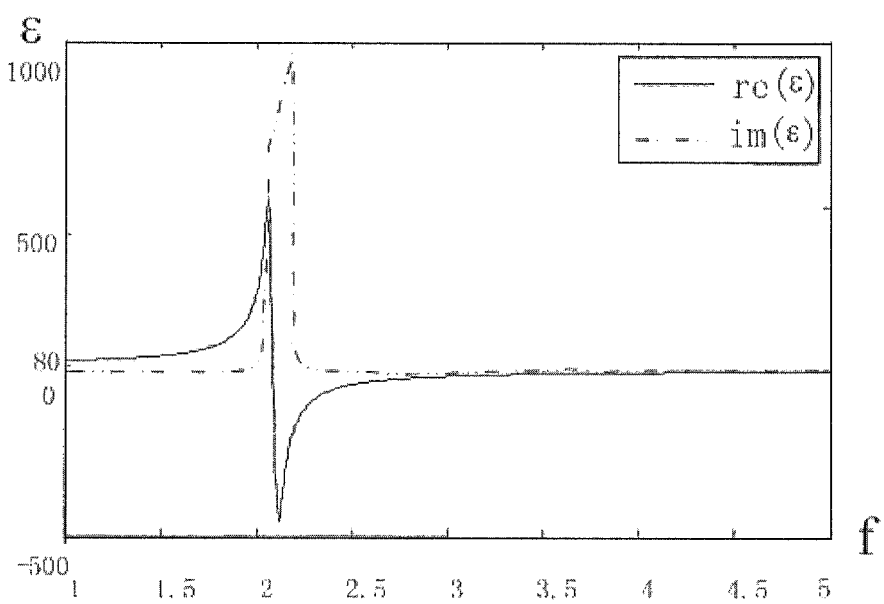
FIG. 30 is a schematic diagram showing the relation between the dielectric constant of the artificial electromagnetic material with the artificial microstructure shown in FIG. 28 and the frequency of electromagnetic wave.
Figure 31:
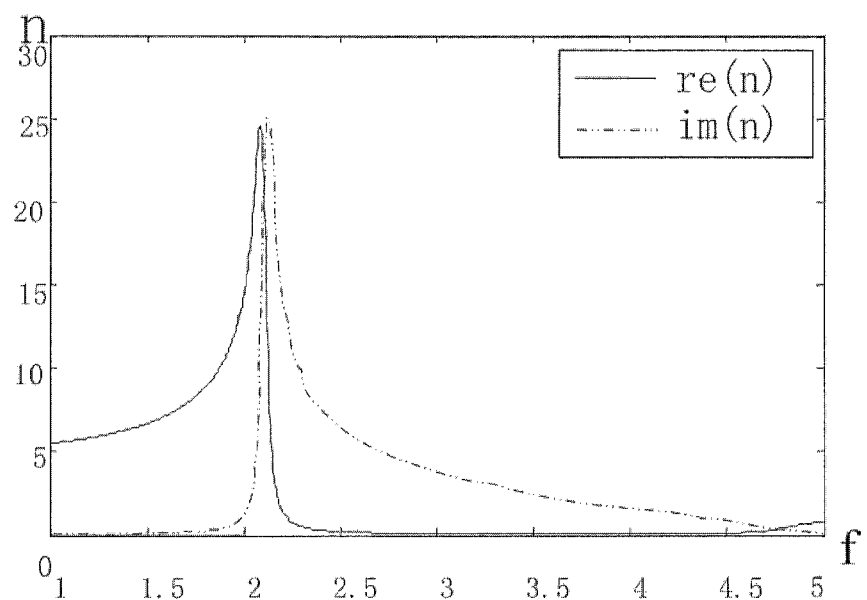
FIG. 31 is a schematic diagram showing the relation between the refractive index of the artificial electromagnetic material with the artificial microstructure shown in FIG. 28 and the frequency of electromagnetic wave.

As shown in FIG. 30, the x-coordinate represents the frequency of the electromagnetic wave, and the y-coordinate represents the dielectric constant of the artificial microstructure in the present embodiment. The solid curve represents the real part (re) of the dielectric constant, showing the value of the dielectric constant; the dashed curve represents the imaginary part (im) of the dielectric constant, showing the loss of the electromagnetic waves. Obviously, the frequency of electromagnetic energy can be in the frequency band from 1 GHz to 2 GHz, and the dielectric constant of the artificial microstructure is very stable and much greater than 80, wherein, the dielectric constant exceeds 230 at 2 GHz, and the loss is small and in an acceptable range. Moreover, in the frequency band from 1 GHz to 2 GHz, the refractive index of the artificial microstructure is also very stable, having little change, and reaches to about 15 at 2 GHz. As shown in FIG. 31, the horizontal axis represents the frequency of the electromagnetic wave, and the vertical axis represents the refractive index of the artificial microstructure in this embodiment. The solid curve indicates that the refractive index changes with the change of the frequency of the electromagnetic wave, and the dashed curve represents the loss curve of the refractive index. According to actual situation, the dielectric constant of the electromagnetic wave can also be designed to be stable and greater in a given band of frequency, and it is not limited to the electromagnetic spectrum herein.

Figure 32:
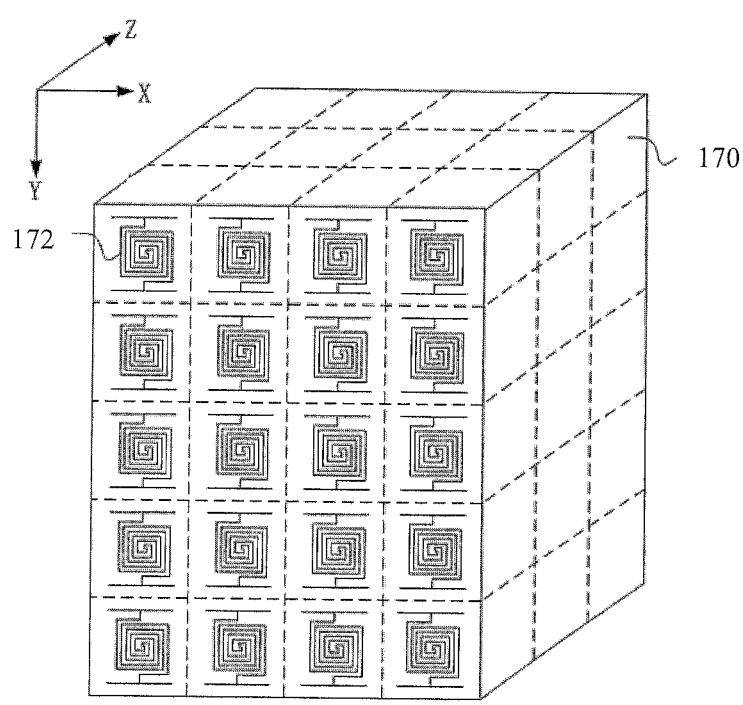
FIG. 32 is a schematic diagram of an artificial electromagnetic material, according to a fourteenth embodiment of the present disclosure.
Figure 33:
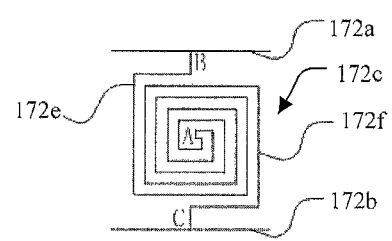
FIG. 33 is a schematic diagram of an artificial microstructure of the artificial electromagnetic material shown in FIG. 32.

Referring to FIGS. 32-33 in combination, the difference between the artificial microstructure 172 of the artificial electromagnetic material 170 provided in a fourteenth embodiment of the present invention and the artificial microstructure shown in FIG. 1 is that the third segment 172c of the artificial microstructure 172 includes two spiral wires which are parallelly convoluted in a same direction, from two ends of the third segment 172c. Specifically, the third segment 172c is bent into two parallel segments AB and AC, based on a point A in the middle, as the inflection point. The two segments are outwardly winded at the inflection point, from the inner circle to the outer circle, in a clockwise way, to form two parallel square spiral wires 172e and 172f. Wherein, the free end B of the spiral wire 172e is connected to the first segment 172a, and the free end C of the spiral wire 172f is connected to the second segment 172b.

Figure 34:
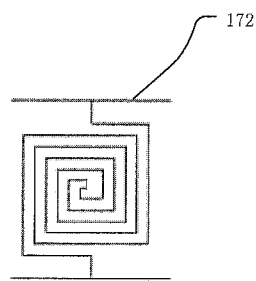
FIG. 34 is a schematic diagram of an artificial microstructure, according to a fifteenth embodiment of the present disclosure.
Figure 35:
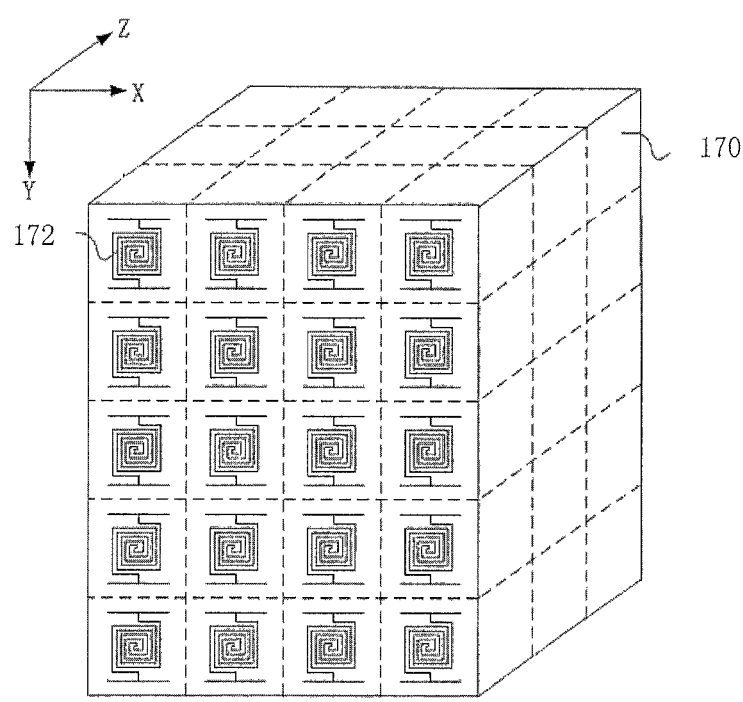
FIG. 35 is a schematic diagram of an artificial electromagnetic material employing the artificial microstructure shown in FIG. 34.

Referring to FIG. 34, the difference between the artificial microstructure 172 provided in a fifteenth embodiment of the present invention and the artificial microstructure shown in FIG. 33 is: the two segments winded at the point in the middle of the third segment are outwardly winded at the inflection point, from the inner circle to the outer circle, in a counter-clockwise way, to form two parallel square spiral wires. The artificial electromagnetic material 170 employing the artificial microstructure 172, as shown in FIG. 34, is shown in FIG. 35.

Figure 36:
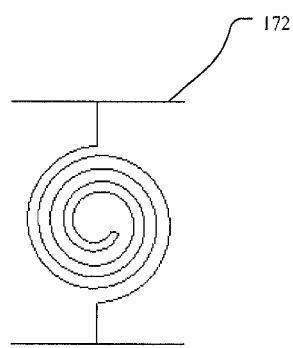
FIG. 36 is a schematic diagram of an artificial microstructure, according to a sixteenth embodiment of the present disclosure.
Figure 37:
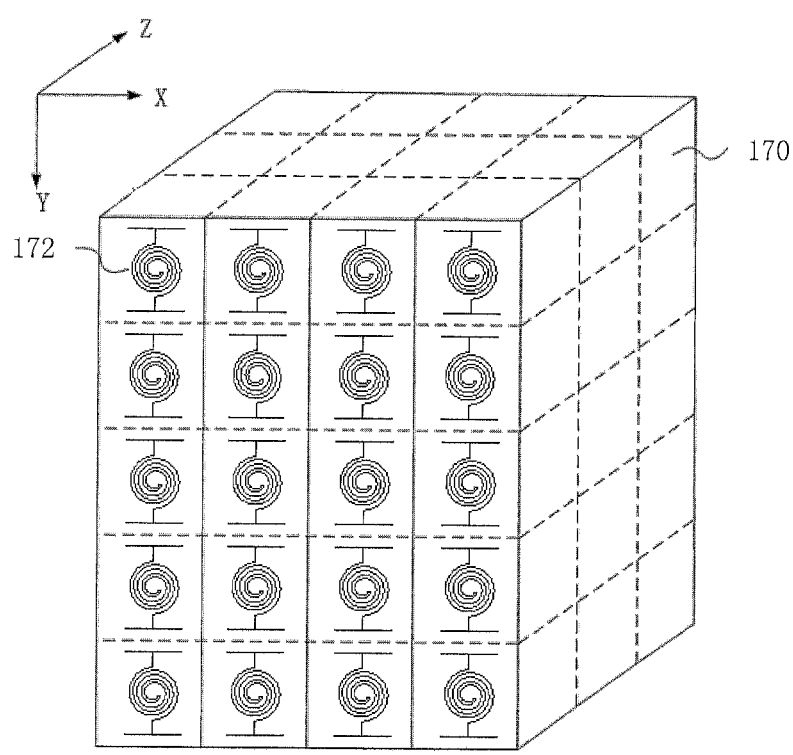
FIG. 37 is a schematic diagram of an artificial electromagnetic material employing the artificial microstructure shown in FIG. 36.

Referring to FIG. 36, the difference between the artificial microstructure 172 provided in a sixteenth embodiment of the present invention and the artificial microstructure shown in FIG. 33 is: the two segments winded at the point in the middle of the third segment are outwardly winded at the inflection point, from the inner circle to the outer circle, in a clockwise way, to form two parallel circular spiral wires. The artificial electromagnetic material 170 employing the artificial microstructure 172, as shown in FIG. 36, is shown in FIG. 37.

Figure 38:
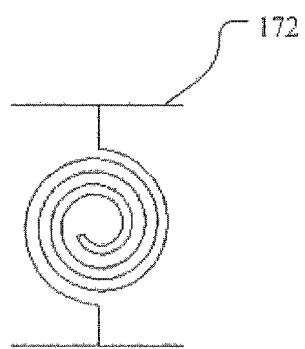
FIG. 38 is a schematic diagram of an artificial microstructure, according to a seventeenth embodiment of the present disclosure.
Figure 39:
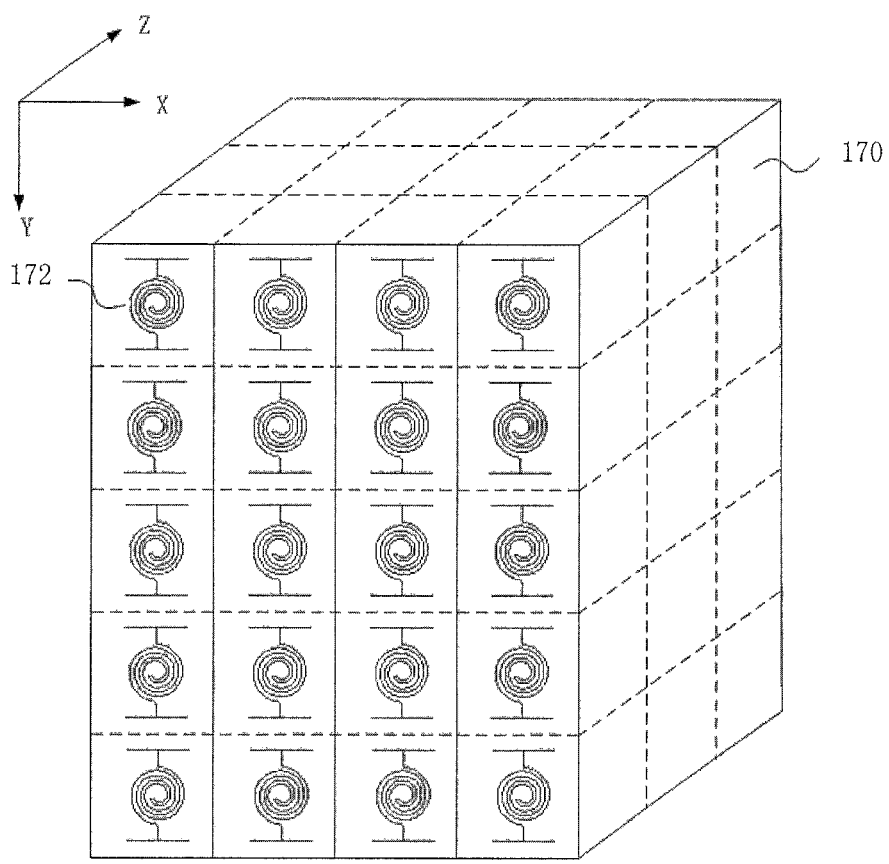
FIG. 39 is a schematic diagram of an artificial electromagnetic material employing the artificial microstructure shown in FIG. 38.

Referring to FIG. 38, the difference between the artificial microstructure 172 provided in a seventeenth embodiment of the present invention and the artificial microstructure shown in FIG. 33 is: the two segments winded at the point in the middle of the third segment are outwardly winded at the inflection point, from the inner circle to the outer circle, in a counterclockwise way, to form two parallel circular spiral wires. The artificial electromagnetic material 170 employing the artificial microstructure 172, as shown in FIG. 38, is shown in FIG. 39.

Figure 40:
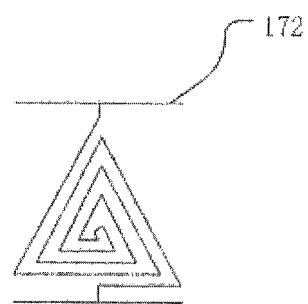
FIG. 40 is a schematic diagram of an artificial microstructure, according to an eighteenth embodiment of the present disclosure.
Figure 41:
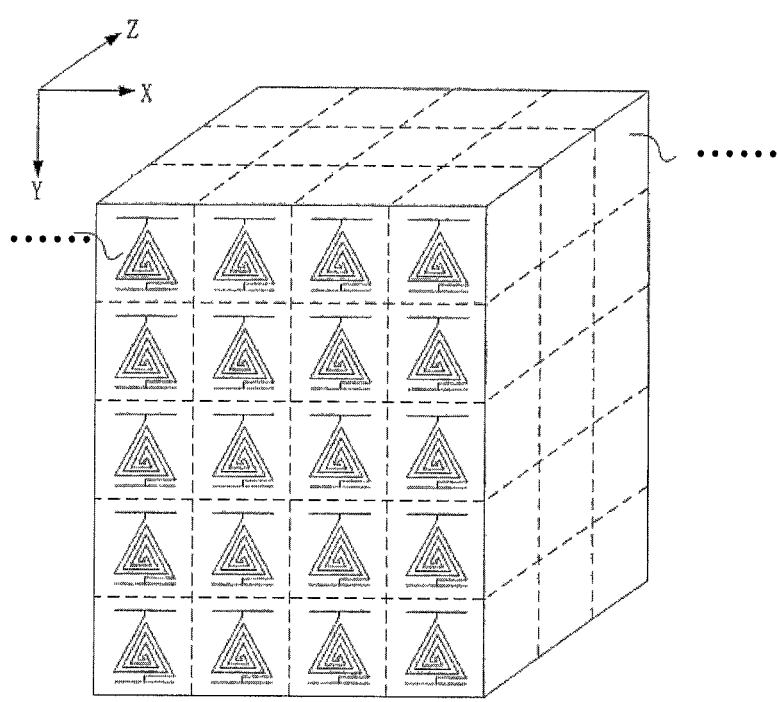
FIG. 41 is a schematic diagram of artificial electromagnetic material employing the artificial microstructure shown in FIG. 40.

Referring to FIG. 40, the difference between the artificial microstructure 172 provided in an eighteenth embodiment of the present invention and the artificial microstructure shown in FIG. 33 is: the two segments winded at the point in the middle of the third segment are outwardly winded at the inflection point, from the inner circle to the outer circle, in a clockwise way, to form two parallel triangle spiral wires. The artificial electromagnetic material 170 employing the artificial microstructure 172, as shown in FIG. 40, is shown in FIG. 41.

Figure 42:
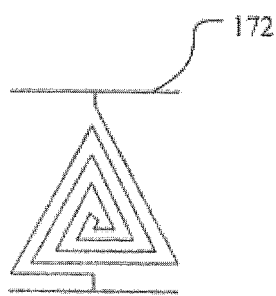
FIG. 42 is a schematic diagram of an artificial microstructure, according to a nineteenth embodiment of the present disclosure.
Figure 43:
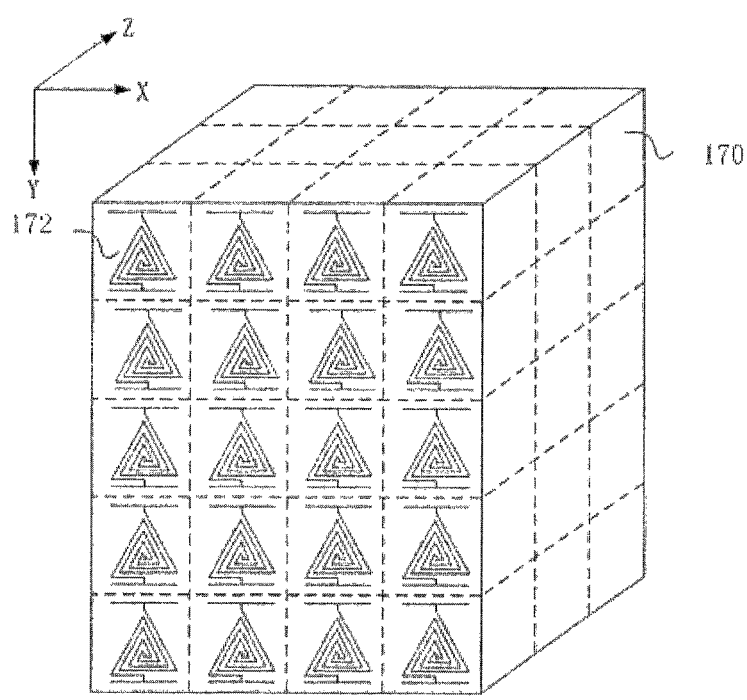
FIG. 43 is a schematic diagram of an artificial electromagnetic material employing the artificial microstructure shown in FIG. 42.

Referring to FIG. 42, the difference between the artificial microstructure 172 provided in a nineteenth embodiment of the present invention and the artificial microstructure shown in FIG. 33 is: the two segments winded at the point in the middle of the third segment are outwardly winded at the inflection point, from the inner circle to the outer circle, in a counterclockwise way, to form two parallel triangle spiral wires. The artificial electromagnetic material 170 employing the artificial microstructure 172, as shown in FIG. 42, is shown in FIG. 43.

By changing the arrangement of the third segment in the middle of the 工-shaped artificial microstructure of the first embodiment, i.e. constructing two parallel spiral structures connected at the inflection point, the length of the third segment is increased. Through simulation, the results show that, in a very wide band of frequency, the dielectric constant of the artificial electromagnetic material having such artificial microstructure is very stable. And compared to the artificial electromagnetic material having 工-shaped artificial microstructure, the dielectric constant and the refractive index thereof are significantly increased. Such artificial electromagnetic material with high dielectric constant can be applied in the field of antenna manufacturing and semiconductor manufacturing. And since breaking through the limitation of the dielectric constant in per volume unit, as the defects in the existing technology, this technical solution can play an invaluable role for the miniaturization of microwave devices as well.

Figure 44:
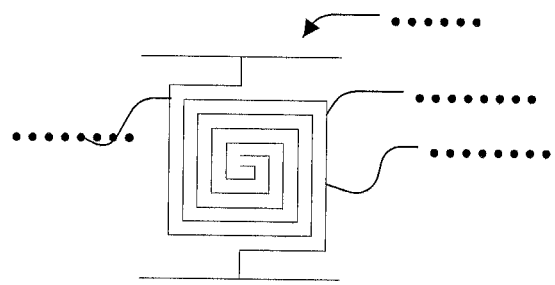
FIG. 44 is a schematic diagram of an artificial microstructure, according to a twentieth embodiment of the present disclosure.
Figure 45:
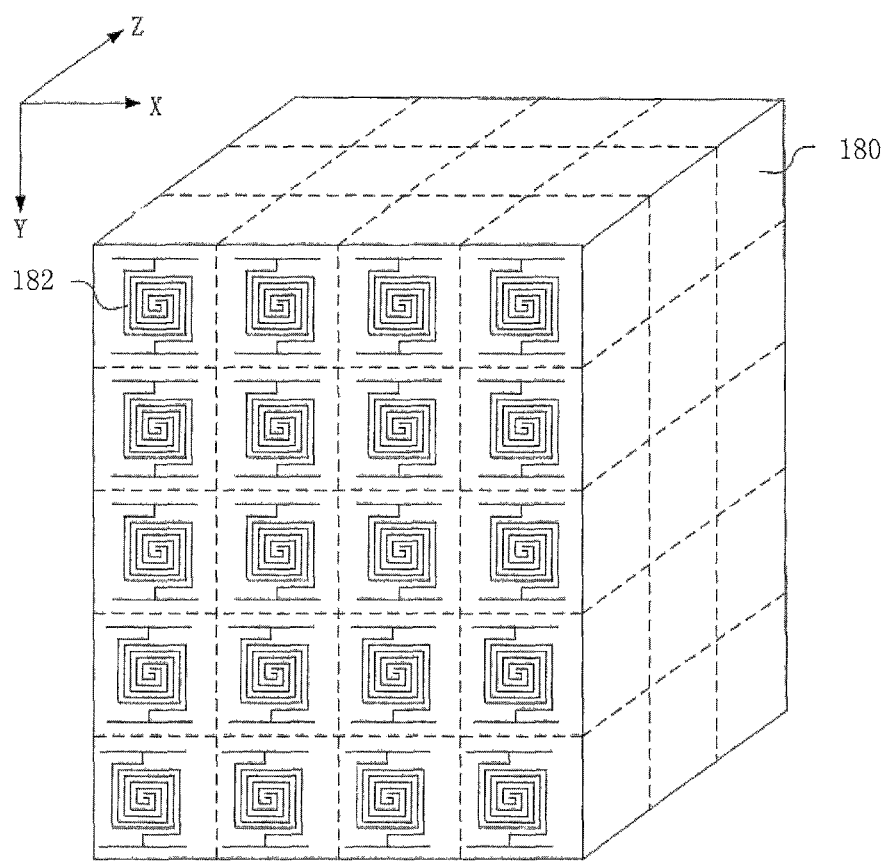
FIG. 45 is a schematic diagram of an artificial electromagnetic material employing the artificial microstructure shown in FIG. 44.

Referring to FIGS. 44-45 in combination, the difference between the artificial microstructure 182 of the artificial electromagnetic material 180 provided in a twentieth embodiment of the present invention and the artificial microstructure shown in FIG. 33 is that the portions located in the center of the spiral of the two spiral wires 182e, 182f of the third segment 182c of the artificial microstructure 182 are disconnected from each other, and form two disjoint and independent square spiral wires.

Figure 46:
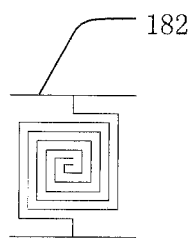
FIG. 46 is a schematic diagram of an artificial microstructure, according to a twenty-first embodiment of the present disclosure.
Figure 47:
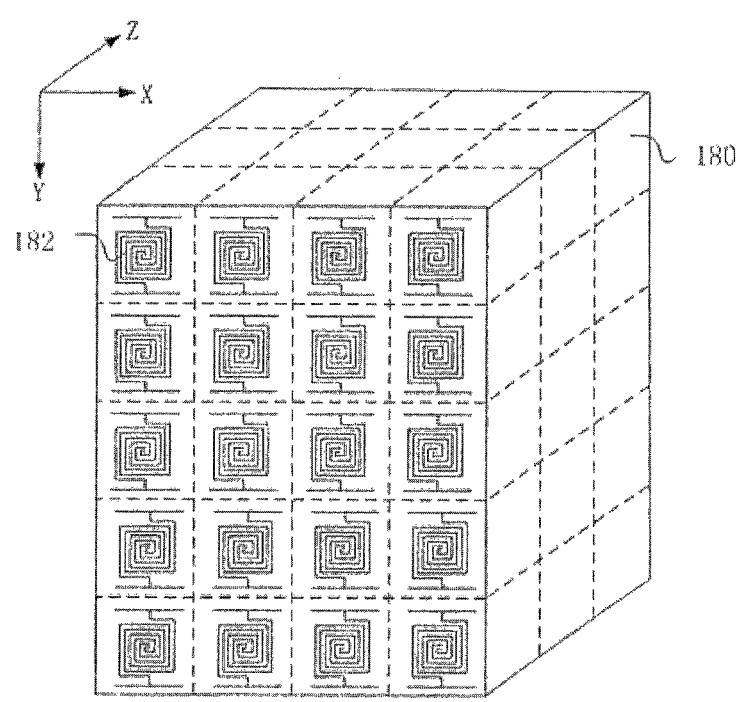
FIG. 47 is a schematic diagram of an artificial electromagnetic material employing the artificial microstructure shown in FIG. 46.

Referring to FIG. 46, the difference between the artificial microstructure 182 provided in a twenty-first embodiment of the present invention and the artificial microstructure shown in FIG. 44 is the two segments of the spiral wires are inwardly winded from the outer circle to the inner circle, in a clockwise way, to form two square spiral wires. The artificial electromagnetic material 180 employing the artificial microstructure 182, as shown in FIG. 46, is shown in FIG. 47.

Figure 48:
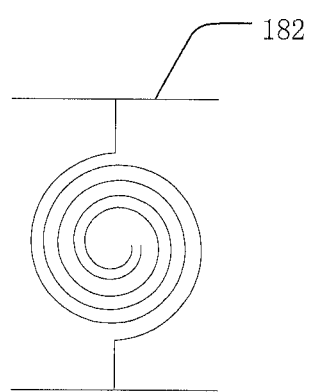
FIG. 48 is a schematic diagram of an artificial microstructure, according to a twenty-second embodiment of the present disclosure.
Figure 49:
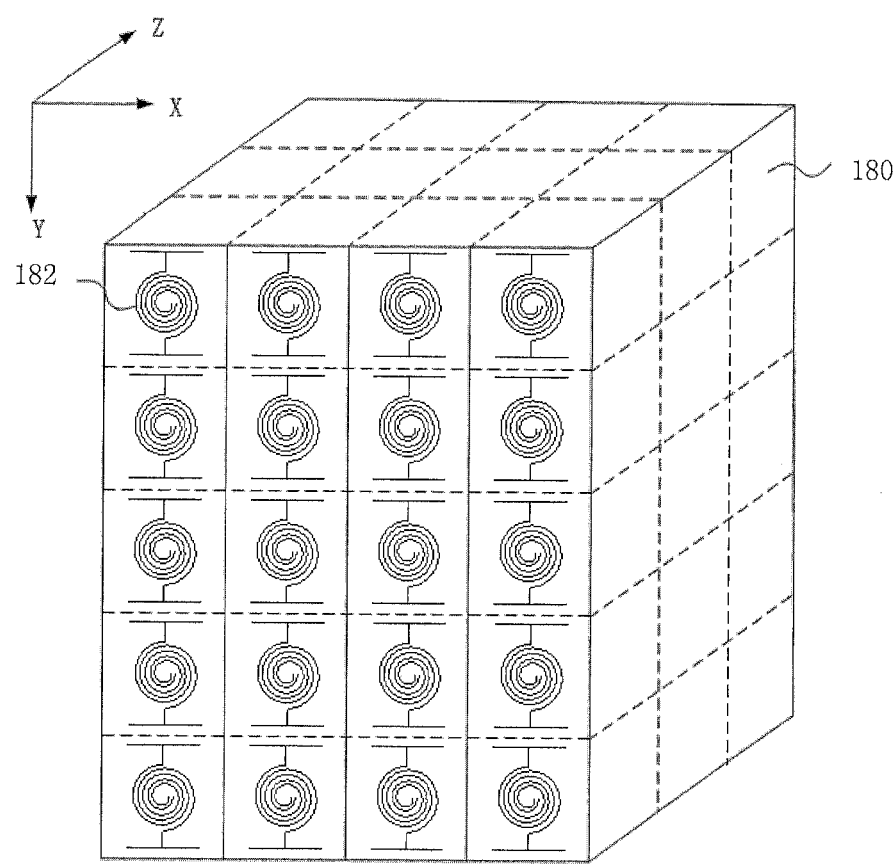
FIG. 49 is a schematic diagram of an artificial electromagnetic material employing the artificial microstructure shown in FIG. 48.

Referring to FIG. 48, the difference between the artificial microstructure 182 provided in a twenty-second embodiment of the present invention and the artificial microstructure shown in FIG. 44 is: the two segments of the spiral wires are inwardly winded from the outer circle to the inner circle, in a counterclockwise way, to form two circular spiral wires. The artificial electromagnetic material 180 employing the artificial microstructure 182, as shown in FIG. 48, is shown in FIG. 49.

Figure 50:
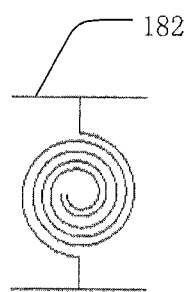
FIG. 50 is a schematic diagram of an artificial microstructure, according to a twenty-third embodiment of the present disclosure.
Figure 51:
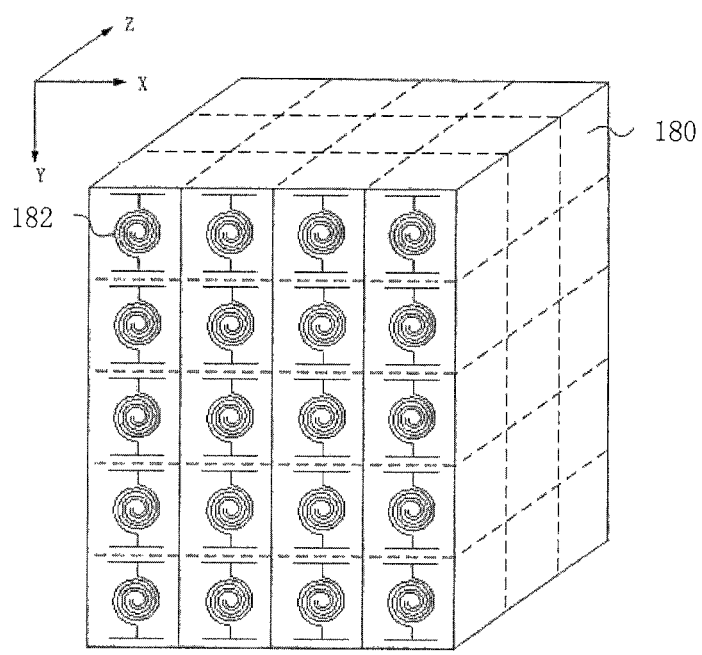
FIG. 51 is a schematic diagram of an artificial electromagnetic material employing the artificial microstructure shown in FIG. 50.

Referring to FIG. 50, the difference between the artificial microstructure 182 provided in a twenty-third embodiment of the present invention and the artificial microstructure shown in FIG. 44 is: the two segments of the spiral wires are inwardly winded from the outer circle to the inner circle, in a clockwise way, to form two circular spiral wires. The artificial electromagnetic material 180 employing the artificial microstructure 182, as shown in FIG. 50, is shown in FIG. 51.

Figure 52:
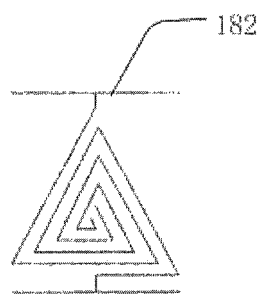
FIG. 52 is a schematic diagram of an artificial microstructure, according to a twenty-fourth embodiment of the present disclosure.
Figure 53:
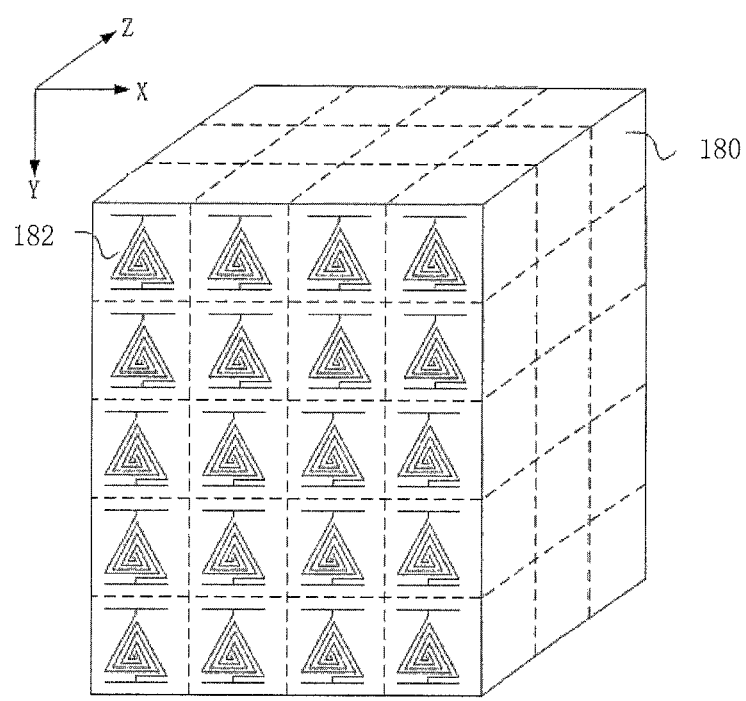
FIG. 53 is a schematic diagram of an artificial electromagnetic material employing the artificial microstructure shown in FIG. 52.

Referring to FIG. 52, the difference between the artificial microstructure 182 provided in a twenty-fourth embodiment of the present invention and the artificial microstructure shown in FIG. 44 is: the two segments of the spiral wires are inwardly winded from the outer circle to the inner circle, in a counterclockwise way, to form two triangle spiral wires. The artificial electromagnetic material 180 employing the artificial microstructure 182, as shown in FIG. 52, is shown in FIG. 53.

Figure 54:
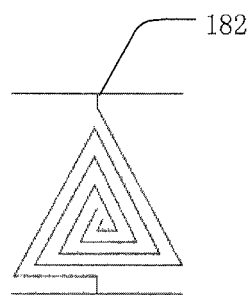
FIG. 54 is a schematic diagram of an artificial microstructure, according to a twenty-fifth embodiment of the present disclosure.
Figure 55:
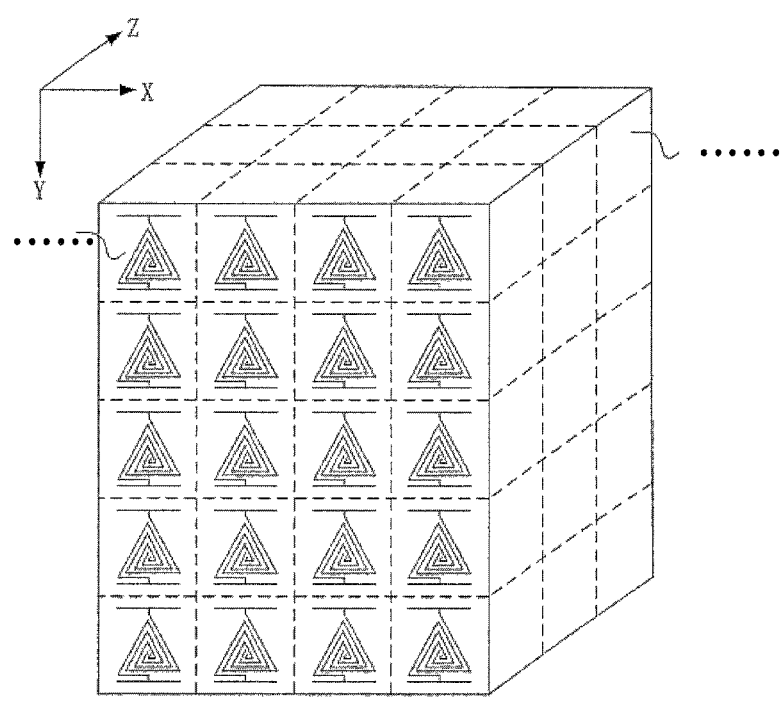
FIG. 55 is a schematic diagram of an artificial electromagnetic material employing the artificial microstructure shown in FIG. 54.

Referring to FIG. 54, the difference between the artificial microstructure 182 provided in a twenty-fourth embodiment of the present invention and the artificial microstructure shown in FIG. 44 is: the two segments of the spiral wires are inwardly winded from the outer circle to the inner circle, in a clockwise way, to form two triangle spiral wires. The artificial electromagnetic material 180 employing the artificial microstructure 182, as shown in FIG. 54, is shown in FIG. 55.

By changing the arrangement of the third segment in the middle of the 工-shaped artificial microstructure of the first embodiment, i.e. constructing two independent spiral structures, the facing area of two metal wires of the third segment is increased. The capacitance is proportional to the facing area of the metal wires, while the dielectric constant is proportional to the capacitance. Through simulation, the results show that, in a very wide band of frequency, the dielectric constant of the artificial electromagnetic material having such artificial microstructure is very stable. And compared to the artificial electromagnetic material having 工-shaped artificial microstructure, the dielectric constant and the refractive index thereof are significantly increased. Such artificial electromagnetic material with high dielectric constant can be applied in the field of antenna manufacturing and semiconductor manufacturing. And since breaking through the limitation of the dielectric constant in per volume unit, as the defects in the existing technology, this technical solution can play an invaluable role for the miniaturization of microwave devices as well.

The artificial electromagnetic material used in the above embodiments is a new material with special electromagnetic effects. The artificial electromagnetic material can replace the existing magnetic material, and be applied to various applications for electromagnetic waves, for example, it can be applied to electromagnetic wave propagation modulation materials and devices, such as antenna, smart antennas, angle zooming and so on, or applied to the field of electromagnetic mode modulation of the waveguide system, functional polarization modulation devices, microwave circuits, THz (terahertz), or optical applications.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. An artificial microstructure employed in an artificial electromagnetic material comprising a first segment, a second segment, and a third segment, wherein the first segment is parallel to the second segment, and the third segment is connected between the first segment and the second segment;
    wherein a bended portion is comprised between two ends of the third segment;
    wherein the bended portion comprises two segments of spiral wires which are parallelly convoluted in a same direction, from two ends of the third segment;
    wherein the portions located in the center of the spiral of the two segments of the spiral wire are disconnected from each other.

2. The artificial microstructure of claim 1, wherein the artificial microstructure comprises a terminal segment group, the terminal segment group comprises a plurality of fourth segments, two ends of the first segment and two ends of the second segment are respectively and perpendicularly connected to one of the fourth segments.

3. The artificial microstructure of claim 2, wherein the artificial microstructure comprises N terminal segment groups, each segment of the N-th terminal segment group is connected to a distal of one segment of the N-1-th terminal segment group, and is perpendicular to the connected segment of the N-1-th segment group, wherein N is an integer number greater than 1.

4. The artificial microstructure of claim 1, wherein the two segments of spiral wire are inwardly winded from the outer circle to the inner circle, in a counterclockwise way, or outwardly winded from the inner circle to the outer circle, in a clockwise way.

5. An artificial electromagnetic material, comprising a substrate and an artificial microstructure, wherein the substrate comprises a plurality of substrate units, the artificial microstructure is formed in each of the substrate units, the artificial microstructure comprises a first segment, a second segment, and a third segment, wherein the first segment is parallel to the second segment, and the third segment is connected between the first segment and the second segment;
    wherein a bended portion is comprised between two ends of the third segment;
    wherein the bended portion comprises two segments of spiral wires which are parallelly convoluted in a same direction, from two ends of the third segment;
    wherein the portions located in the center of the spiral of the two segments of the spiral wire are disconnected from each other.

6. The artificial electromagnetic material of claim 5, wherein the two segments of spiral wire are inwardly winded from the outer circle to the inner circle, in a counterclockwise way, or outwardly winded from the inner circle to the outer circle, in a clockwise way.

7. The artificial electromagnetic material of claim 5, wherein the artificial microstructure comprises a terminal segment group, the terminal segment group comprises a plurality of fourth segments, two ends of the first segment and two ends of the second segment are respectively and perpendicularly connected to one of the fourth segments.

8. The artificial electromagnetic material of claim 7, wherein the artificial microstructure comprises N terminal segment groups, each segment of the N-th terminal segment group is connected to a distal of one segment of the N-1-th terminal segment group, and is perpendicular to the connected segment of the N-1-th segment group, wherein N is an integer number greater than 1.

9. An artificial microstructure employed in an artificial electromagnetic material comprising a first segment, a second segment, and a third segment, wherein the first segment is parallel to the second segment, and the third segment is connected between the first segment and the second segment, the first segment, the second segment and the third segment form a 工 shaped structure, wherein a quantity of the 工 shaped structure is six, the third segments of two of the 工 shaped structures are perpendicularly connected, and the connection point is located in the center of the two third segments, the remaining four 工 -shaped structures are 90-degree rotationally symmetrical to the connection point.

10. An artificial microstructure employed in an artificial electromagnetic material, comprising a fence structure, the fence structure comprising a first segment, a second segment, and a third segment, wherein the first segment is parallel to the second segment, and the third segment is connected between the first segment and the second segment, and the fence structure further comprises an intermediate segment group, the intermediate segment group comprises at least two fifth segments, the at least two fifth segments are connected to the third segment and equally divided by the third segment, the at least two fifth segments are parallel to the first segment and the second segment; wherein the length of the first segment, the second segment, and the fifth segments, along the third segment, gradually increases from the midpoint of the third segment to two sides of the midpoint, or gradually decreases from the midpoint of the third segment to two sides of the midpoint.

11. The artificial microstructure of claim 10, wherein the artificial structure comprises two said fence structures, the third segments of the two fence structures are perpendicularly connected to each other, and the connection point is in the middle of the two third segments.

* * * * *